US012757344B2

(12) United States Patent
Hur et al.

(10) Patent No.: US 12,757,344 B2
(45) Date of Patent: Oct. 6, 2026

(54) SOLID STATE DRIVE APPARATUS

(71) Applicant: Samsung Electronics Co., Ltd., Suwon-si (KR)

(72) Inventors: Sungchul Hur, Suwon-si (KR); Bumjun Kim, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 197 days.

(21) Appl. No.: 18/756,211

(22) Filed: Jun. 27, 2024

(65) Prior Publication Data

US 2025/0081375 A1 Mar. 6, 2025

(30) Foreign Application Priority Data

Sep. 1, 2023 (KR) ........................ 10-2023-0116268

(51) Int. Cl.

| | |
|---|---|
| ***H05K 7/20*** | (2006.01) |
| ***H01R 12/77*** | (2011.01) |
| ***H05K 1/02*** | (2006.01) |
| ***H05K 7/14*** | (2006.01) |

(52) U.S. Cl.

CPC ........... *H05K 7/1432* (2013.01); *H01R 12/77* (2013.01); *H05K 1/0281* (2013.01)

(58) Field of Classification Search

CPC .................................................... H05K 7/1432

See application file for complete search history.

(56) References Cited

U.S. PATENT DOCUMENTS

| | | | | |
|---|---|---|---|---|
| 7,517,252 | B2 | 4/2009 | Ni et al. | |
| 9,552,848 | B2 * | 1/2017 | Mangay-Ayam, Jr. | H05K 7/1461 |
| 11,056,416 | B2 | 7/2021 | Kim et al. | |
| 11,212,949 | B2 * | 12/2021 | Kim | H05K 7/20472 |
| 2014/0111069 | A1 * | 4/2014 | Chen | G06F 1/1658 312/223.2 |
| 2021/0092871 | A1 * | 3/2021 | Hur | H05K 1/0203 |

FOREIGN PATENT DOCUMENTS

| | | | |
|---|---|---|---|
| JP | H0546080 | U | 6/1993 |
| JP | H0968343 | A | 3/1997 |
| JP | H09293979 | A | 11/1997 |
| JP | H11145650 | A | 5/1999 |
| JP | 2003-219540 | A | 7/2003 |
| JP | 2020-115571 | A | 7/2020 |
| KR | 10-2020-0028057 | A | 3/2020 |

* cited by examiner

*Primary Examiner* — Mukundbhai G Patel

(74) *Attorney, Agent, or Firm* — Fish & Richardson P.C.

(57) ABSTRACT

A solid state drive apparatus includes a housing including a top cover and a bottom cover that define an internal space of the housing, and a plurality of package substrate modules accommodated in the internal space of the housing. The package substrate modules include a top package substrate module having a top package base substrate, and a bottom package substrate module having a bottom package base substrate. The top package substrate module and the bottom package substrate module are separated from each other in a vertical direction. The top package base substrate includes a plurality of top protrusions and a plurality of top notches, and the bottom package base substrate includes a plurality of bottom protrusions and a plurality of bottom notches.

20 Claims, 32 Drawing Sheets

SOLID STATE DRIVE APPARATUS

CROSS-REFERENCE TO RELATED APPLICATION

This application is based on and claims priority under 35 U.S.C. § 119 to Korean Patent Application No. 10-2023-0116268, filed on Sep. 1, 2023, in the Korean Intellectual Property Office, the disclosure of which is incorporated by reference herein in its entirety.

BACKGROUND

The present disclosure relates to solid state drive apparatuses, and more particularly to solid state drive apparatuses having a housing in which at least two package substrate modules are accommodated.

Solid state drive apparatuses have been contemplated as next-generation storage devices for replacing existing hard disk drives. A solid state drive apparatus is a storage device based on non-volatile memory and has low power consumption and high storage density. Also, with a solid state drive apparatus used as a storage device, it is possible to input and output a large amount of data at high speed to and from the solid state drive apparatus, and thus, demand for solid state drive apparatuses has increased.

Systems including solid state drive apparatuses are demanded to have high performance and small size, and thus, a decrease in the volume of a solid state drive apparatus has also been demanded.

SUMMARY

The present disclosure provides a solid state drive apparatus having reduced volume.

Example embodiments of the inventive concepts provide a solid state drive apparatus including a housing including a top cover and a bottom cover, the top cover and the bottom cover defining an internal space of the housing; and a plurality of package substrate modules accommodated in the internal space, the plurality of package substrate modules including a top package substrate module having a top package base substrate and a bottom package substrate module having a bottom package base substrate, the top package substrate module and the bottom package substrate module being separated from each other in a vertical direction. The top package base substrate includes a plurality of top protrusions and a plurality of top notches. The bottom package base substrate includes a plurality of bottom protrusions and a plurality of bottom notches. The top cover includes a plurality of protruding bar pressing portions corresponding to the plurality of bottom protrusions and a plurality of protruding round pressing portions corresponding to the plurality of bottom notches. The bottom cover includes a plurality of protruding bar seating portions corresponding to the plurality of top protrusions and a plurality of protruding round seating portions corresponding to the plurality of top notches.

Example embodiments of the inventive concepts further provide a solid state drive apparatus including a housing including a top cover and a bottom cover, the top cover and the bottom cover defining an internal space of the housing; a top package substrate module accommodated in the internal space of the housing, and the top package substrate module including a top package base substrate; a bottom package substrate module separated from the top package substrate module in a vertical direction, the bottom package substrate accommodated in the internal space of the housing, and the bottom package substrate including a bottom package base substrate; and a connection member electrically connecting the top package substrate module to the bottom package substrate module. The housing has a plurality of screw holes at corners of the housing, the plurality of screw holes including a plurality of top screw holes in the top cover and a plurality of bottom screw holes in the bottom cover. The top cover includes a plurality of protruding bar pressing portions and a plurality of protruding round pressing portions at corners of the top cover. The bottom cover includes a plurality of protruding bar seating portions and a plurality of protruding round seating portions at corners of the bottom cover. The top package base substrate includes a plurality of top protrusions and a plurality of top notches, the plurality of top protrusions are in contact with the plurality of protruding bar seating portions of the bottom cover, and the plurality of protruding round pressing portions of the top cover are in contact with the top package base substrate at the plurality of top notches. The bottom package base substrate includes a plurality of bottom protrusions and a plurality of bottom notches, the plurality of bottom notches in contact with the plurality of protruding bar pressing portions of the top cover, and the plurality of protruding round seating portions of the bottom cover are in contact with the bottom package base substrate at the plurality of bottom notches.

Example embodiments of the inventive concepts still further provide a solid state drive apparatus including a housing including a top cover and a bottom cover, the top cover and the bottom cover defining an internal space of the housing; a top package substrate module accommodated in the internal space of the housing, and the top package substrate module including a top package base substrate and upper semiconductor chips mounted on the top package base substrate; a bottom package substrate module separated from the top package substrate module in a vertical direction, the bottom package substrate module accommodated in the internal space of the housing, and the bottom package substrate module including a bottom package base substrate and lower semiconductor chips mounted on the bottom package base substrate; and a connection member including a flexible printed circuitry (FPC) connector electrically connecting the top package substrate module to the bottom package substrate module. The housing has a plurality of screw holes at corners of the housing, the plurality of screw holes including a plurality of top screw holes in the top cover and a plurality of bottom screw holes in the bottom cover. The top cover includes two top lower sidewalls facing each other, two top higher sidewalls facing each other, a plurality of protruding bar pressing portions protruding toward the internal space of the housing from the two top higher sidewalls, and a plurality of protruding round pressing portions protruding toward the internal space of the housing from portions at the plurality of top screw holes. The bottom cover includes two bottom lower sidewalls facing each other, two bottom higher sidewalls facing each other, a plurality of protruding bar seating portions protruding toward the internal space of the housing from the two bottom higher sidewalls, and a plurality of protruding round seating portions protruding toward the internal space of the housing from portions at the plurality of bottom screw holes. The top package base substrate includes a plurality of top protrusions and a plurality of top notches, the plurality of top protrusions are in contact with top surfaces of the plurality of protruding bar seating portions of the bottom cover, and bottom surfaces of the plurality of protruding round pressing portions of the top cover are in contact with the top package base substrate at the plurality of top notches. The bottom package base substrate includes a plurality of bottom protrusions and a plurality of bottom notches, the plurality of bottom protrusions are in contact with bottom surfaces of the plurality of protruding bar pressing portions of the top cover, and top surfaces of the plurality of protruding round seating portions of the bottom cover are in contact with the bottom package substrate at the plurality of bottom notches.

BRIEF DESCRIPTION OF THE DRAWINGS

Some example embodiments of the inventive concepts will be more clearly understood from the following detailed description taken in conjunction with the accompanying drawings in which.

DETAILED DESCRIPTION

When the terms “at least one of A, B, and C” and similar language (e.g., “at least one selected from the group consisting of A, B, and C”) are used in the specification or the claims, these terms may be construed as A only, B only, C only, or any combination of two or more of A, B, and C, such as, for instance, ABC, AB, BC, and AC.

Figure 1A:
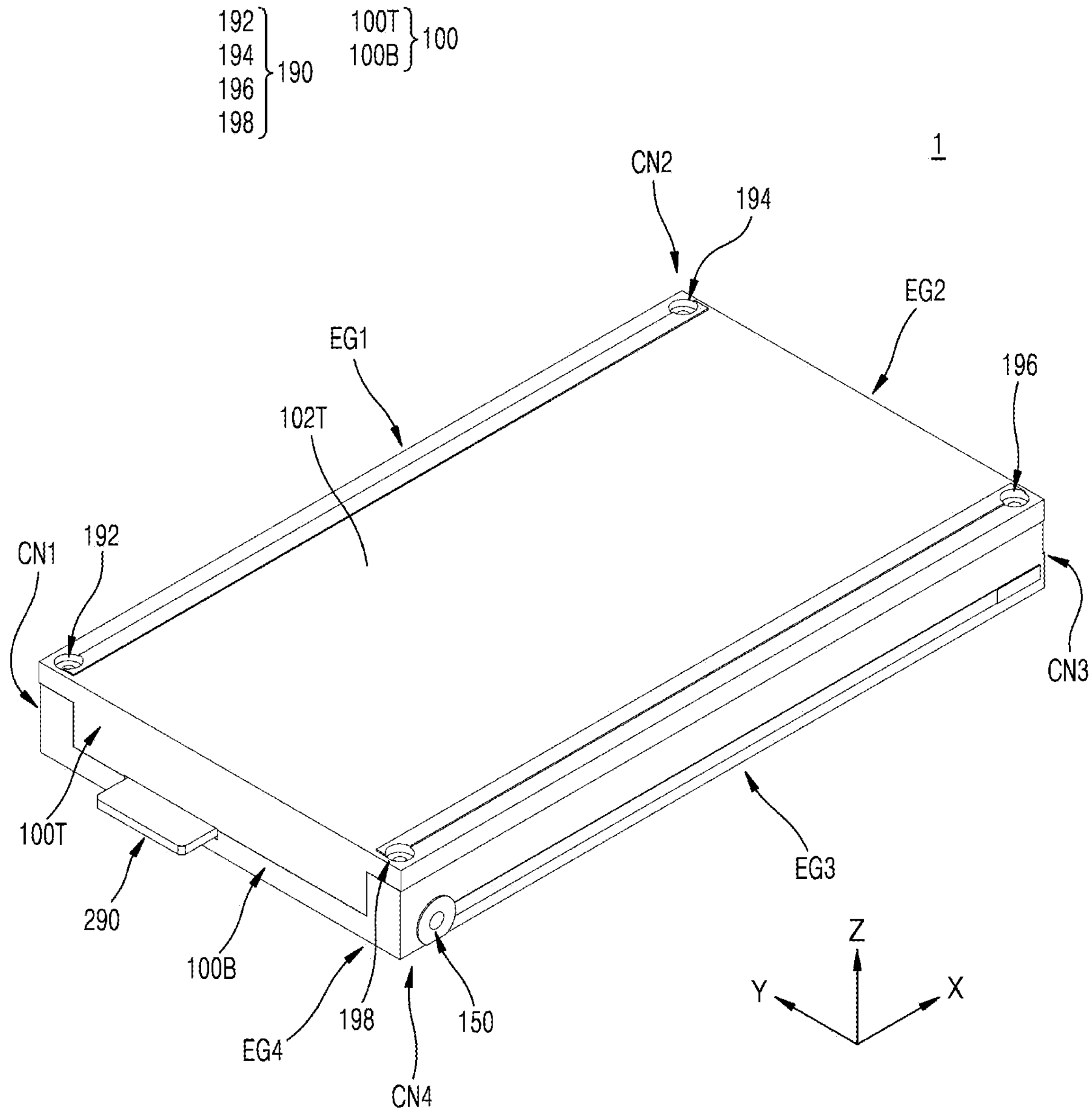
FIGS. 1A and 1B are respectively a perspective view and a transmissive perspective view illustrating a solid state drive apparatus according to some example embodiments of the inventive concepts.
Figure 1B:
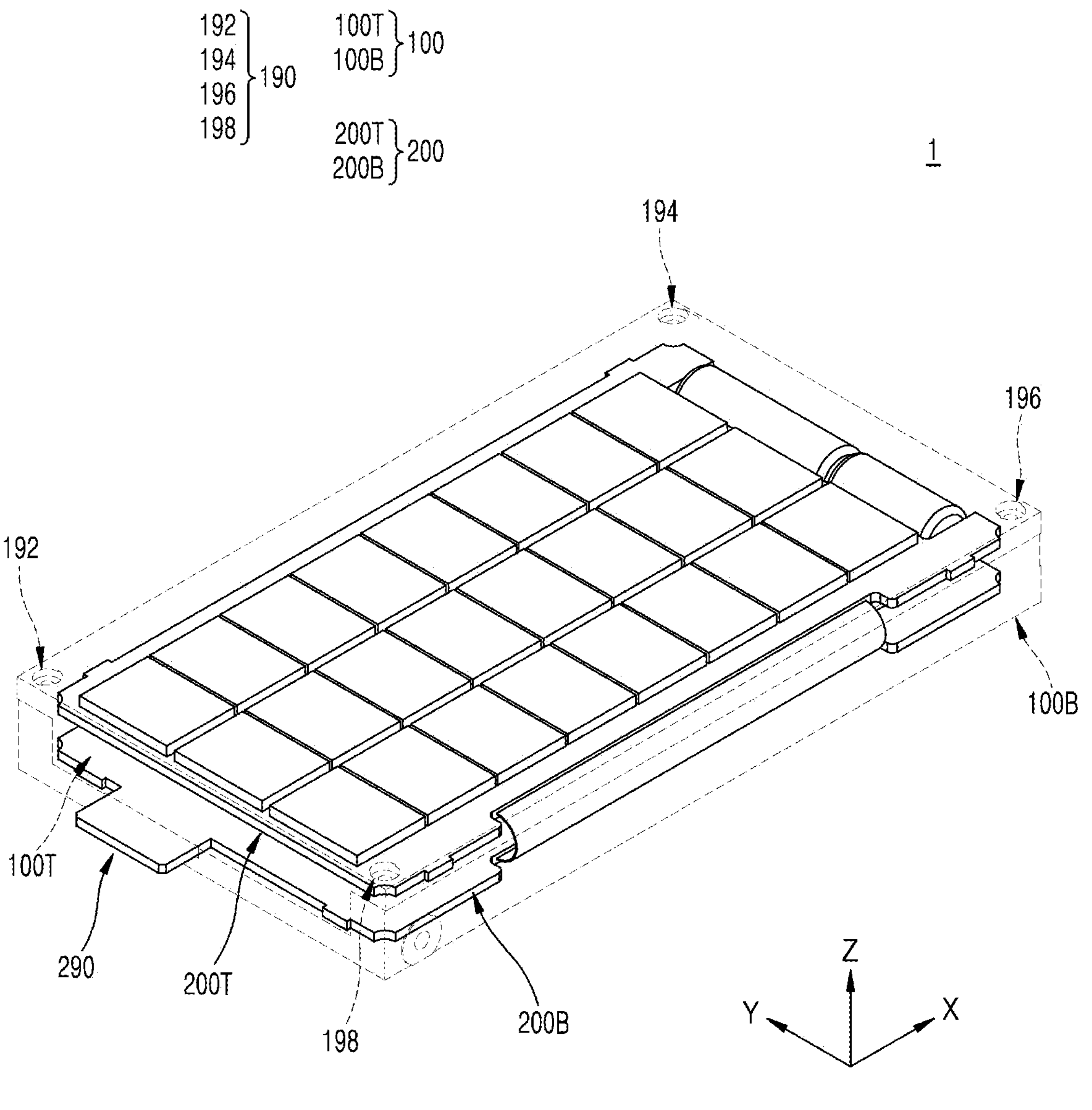

FIGS. 1A and 1B are respectively a perspective view and a transmissive perspective view illustrating a solid state drive apparatus 1 according to some example embodiments.

Referring to FIGS. 1A and 1B, the solid state drive apparatus 1 may include a housing 100 and a plurality of package substrate modules 200 mounted in the housing 100.

The solid state drive apparatus 1 may have a first corner CN1, a second corner CN2, a third corner CN3, a fourth corner CN4, a first edge EG1, a second edge EG2, a third edge EG3, and a fourth edge EG4. In a top view of the solid state drive apparatus 1, the first corner CN1, the second corner CN2, the third corner CN3, and the fourth corner CN4 may be sequential clockwise, and the first edge EG1, the second edge EG2, the third edge EG3, and the fourth edge EG4 may be sequentially connected clockwise. Particularly, the first edge EG1 may be between the first corner CN1 and the second corner CN2 and connected to the second edge EG2 and the fourth edge EG4, the second edge EG2 may be between the second corner CN2 and the third corner CN3 and connected to the first edge EG1 and the third edge EG3, the third edge EG3 may be between the third corner CN3 and the fourth corner CN4 and connected to the second edge EG2 and the fourth edge EG4, and the fourth edge EG4 may be between the fourth corner CN4 and the first corner CN1 and connected to the first edge EG1 and the third edge EG3. In a first horizontal direction (the X direction), the second edge EG2 may be at one side and the fourth edge EG4 may be at the other side. Also, in a second horizontal direction (the Y direction), the first edge EG1 may be at one side and the third edge EG3 may be at the other side. The first horizontal direction (the X direction) may be perpendicular to the second horizontal direction (the Y direction).

Throughout the following disclosure, even when a description is made with reference to a drawing in which the first corner CN1, the second corner CN2, the third corner CN3, the fourth corner CN4, the first edge EG1, the second edge EG2, the third edge EG3, and the fourth edge EG4 are not shown, the first corner CN1, the second corner CN2, the third corner CN3, the fourth corner CN4, the first edge EG1, the second edge EG2, the third edge EG3, and the fourth edge EG4 may be stated with reference to FIG. 1A. Also, even for each of the solid state drive apparatus 1, the housing 100 included in the solid state drive apparatus 1, and the plurality of package substrate modules 200 mounted in the housing 100, the first corner CN1, the second corner CN2, the third corner CN3, the fourth corner CN4, the first edge EG1, the second edge EG2, the third edge EG3, and the fourth edge EG4 may also be used. For example, the first corner CN1 and the first edge EG1 of the housing 100 are the first corner CN1 and the first edge EG1 of the solid state drive apparatus 1, respectively, and the first corner CN1 and the first edge EG1 of each of the plurality of package substrate modules 200 are a corner and an edge facing the first corner CN1 and the first edge EG1 of the housing 100, respectively.

The housing 100 may be made of a single material or a combination of different materials by considering a heat transfer characteristic of the housing (100). The housing 100 may include a metal, a carbon-based material, a polymer material, or a combination thereof, but is not limited thereto. The housing 100 may include, for example, copper (Cu), aluminum (Al), zinc (Zn), tin (Sn), stainless steel, or a clad metal including the same. Alternatively, the housing 100 may include, for example, graphite, graphene, carbon fiber, a carbon nanotube (CNT) composite, or the like. Alternatively, the housing 100 may include, for example, a polymer material, such as an epoxy resin, polymethylmethacrylate (PMMA), polycarbonate (PC), polyethylene (PE), or polypropylene (PP).

The housing 100 may include a top cover 100T and a bottom cover 100B coupled to the top cover 100T. The housing 100 may have therein an internal space surrounded and/or defined by the top cover 100T and the bottom cover 100B and accommodating therein the plurality of package substrate modules 200. A top surface 102T of the top cover 100T may face the outside of the housing 100, and a bottom surface 104T (see FIG. 3B) of the top cover 100T may face the internal space of the housing 100. A top surface 102B (see FIG. 4A) of the bottom cover 100B may face the internal space of the housing 100, and a bottom surface 104B (see FIG. 4C) of the bottom cover 100B may face the outside of the housing 100. The top surface 102T and the bottom surface 104T of the top cover 100T may be referred to as a first top surface 102T and a first bottom surface 104T, respectively, and the top surface 102B and the bottom surface 104B of the bottom cover 100B may be referred to as a second top surface 102B and a second bottom surface 104B, respectively. A plurality of screw holes 190 used to couple the top cover 100T to the bottom cover 100B may be formed at the corners of the housing 100. The plurality of screw holes 190 may include a first screw hole 192, a second screw hole 194, a third screw hole 196, and a fourth screw hole 198. The first screw hole 192, the second screw hole 194, the third screw hole 196, and the fourth screw hole 198 may be at the first corner CN1, the second corner CN2, the third corner CN3, and the fourth corner CN4 of the housing 100, respectively. In the top cover 100T and the bottom cover 100B that are coupled to each other, each of the first screw hole 192, the second screw hole 194, the third screw hole 196, and the fourth screw hole 198 may extend from the top cover 100T to the bottom cover 100B. The plurality of screw holes 190 may be formed at not only the corners of the housing 100 but also the edges of the housing 100. For example, the plurality of screw holes 190 may be formed at not only the first corner CN1, the second corner CN2, the third corner CN3, and the fourth corner CN4 of the housing 100 but also at least one of the first edge EG1, the second edge EG2, the third edge EG3, and the fourth edge EG4 of the housing 100. The housing 100 including the top cover 100T and the bottom cover 100B is described in detail with reference to FIGS. 3A to 3D.

In some example embodiments, the housing 100 may include an external fastening screw hole 150. For example, the external fastening screw hole 150 may be used to couple the housing 100 to an external device.

The plurality of package substrate modules 200 may include an external connector 290. The external connector 290 may connect the solid state drive apparatus 1 to an external host to exchange signals between the solid state drive apparatus 1 and the external host and/or receive power from the external host. The external connector 290 may be connected to an external device in a manner according to, for example, a parallel advanced technology attachment (PATA) standard, a serial advanced technology attachment (SATA) standard, a small computer systems interface (SCSI) standard, or a parallel component interconnect express (PCIe) standard. Herein, the SATA standard involves all SATA-based standards including not only SATA-1 but also SATA-2, SATA-3, external SATA (e-SATA), and the like. The PCIe standard involves all PCIe-based standards including not only PCIe 1.0 but also PCIe 2.0, PCIe 2.1, PCIe 3.0, PCIe 4.0, and the like. The SCSI standard involves all SCSI-based standards including parallel SCSI, serial-attached SCSI (SA-SCSI), Internet SCSI (iSCSI), and the like. In some example embodiments, the external connector 290 may be configured to support an M2 interface, a mini-SATA (mSATA) interface, or a 2.5" interface.

The plurality of package substrate modules 200 may be accommodated in the internal space of the housing 100. The plurality of package substrate modules 200 may include a top package substrate module 200T and a bottom package substrate module 200B. The external connector 290 may be provided to the bottom package substrate module 200B, but is not limited thereto. For example, the external connector 290 may be provided to either the top package substrate module 200T or the bottom package substrate module 200B. In some example embodiments, the external connector 290 may be provided to the fourth edge EG4 of the solid state drive apparatus 1 and protrude to the outside of the housing 100. The plurality of package substrate modules 200 including the top package substrate module 200T and the bottom package substrate module 200B are described in detail with reference to FIGS. 2A to 2E.

Figure 2A:
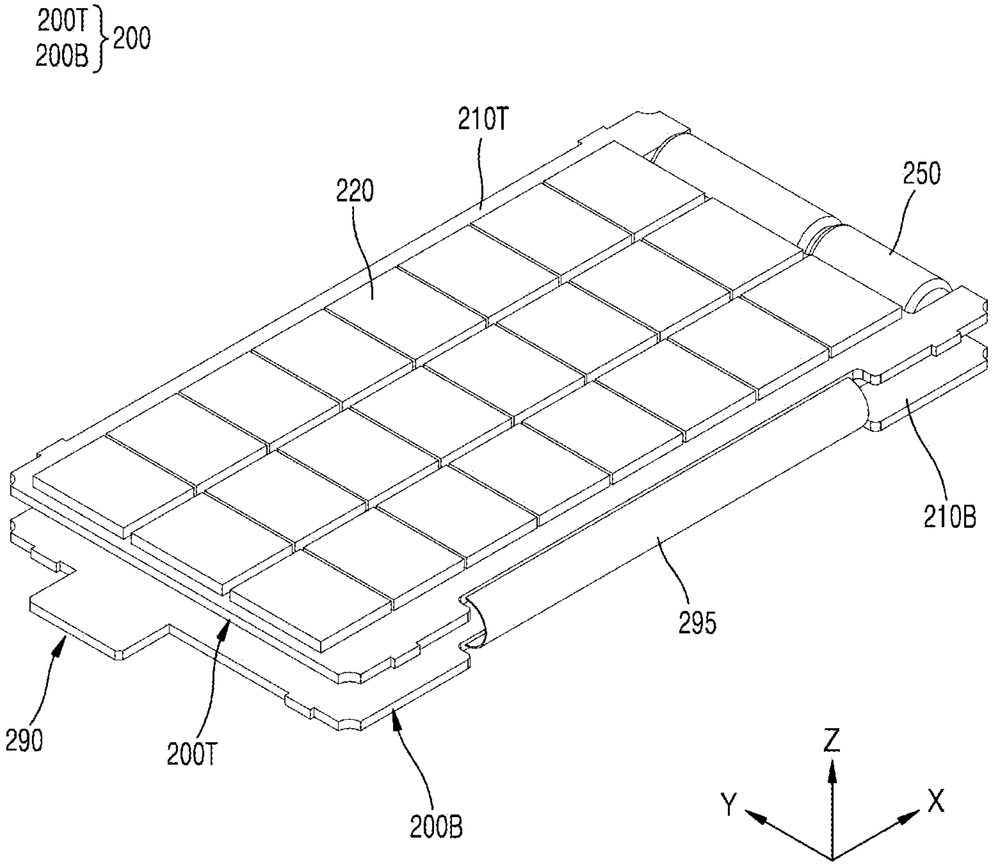
FIGS. 2A, 2B, 2C, 2D and 2E are perspective views and plan views illustrating package substrate modules of a solid state drive apparatus according to some example embodiments of the inventive concepts.
Figure 2B:
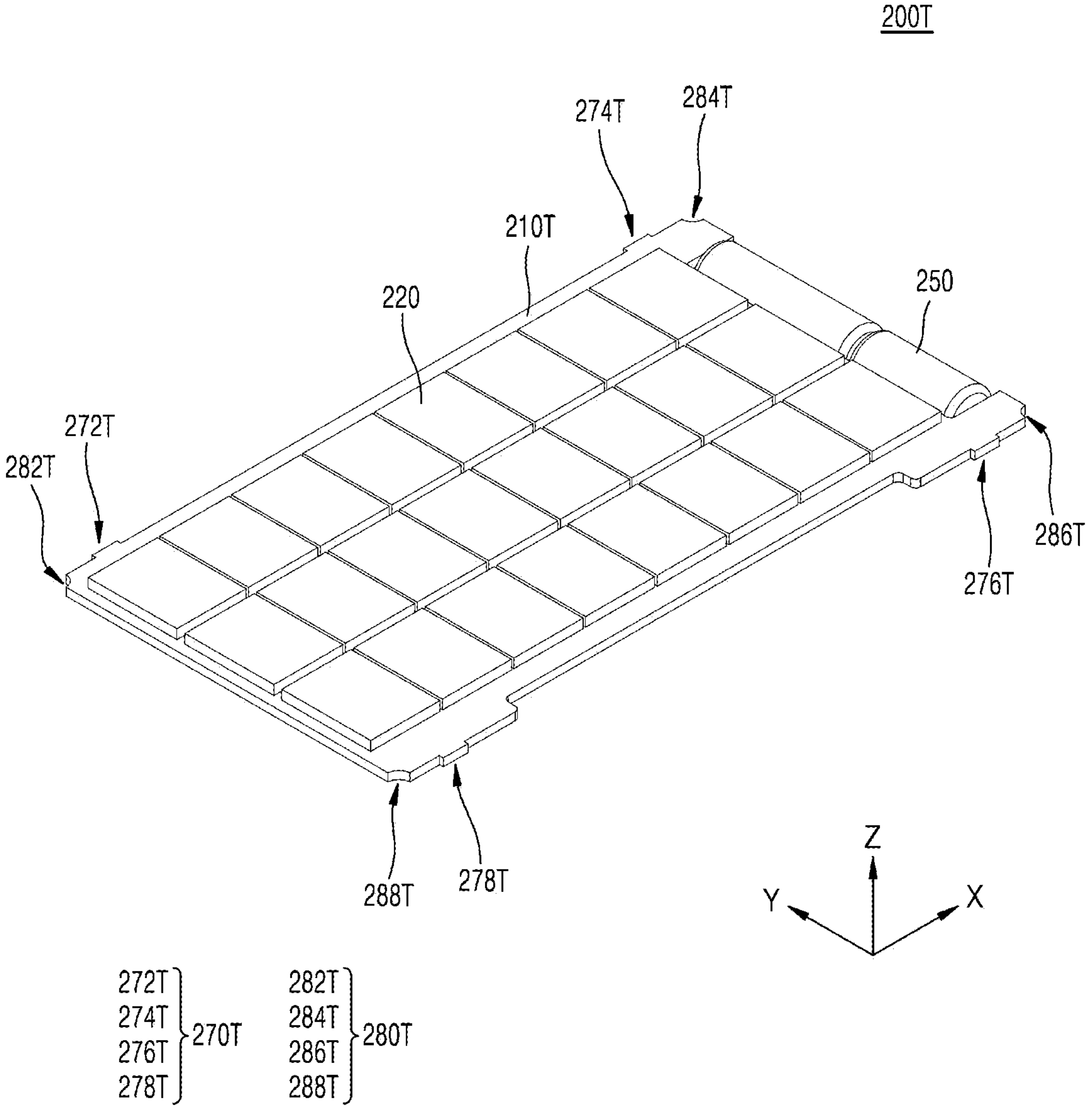
Figure 2C:
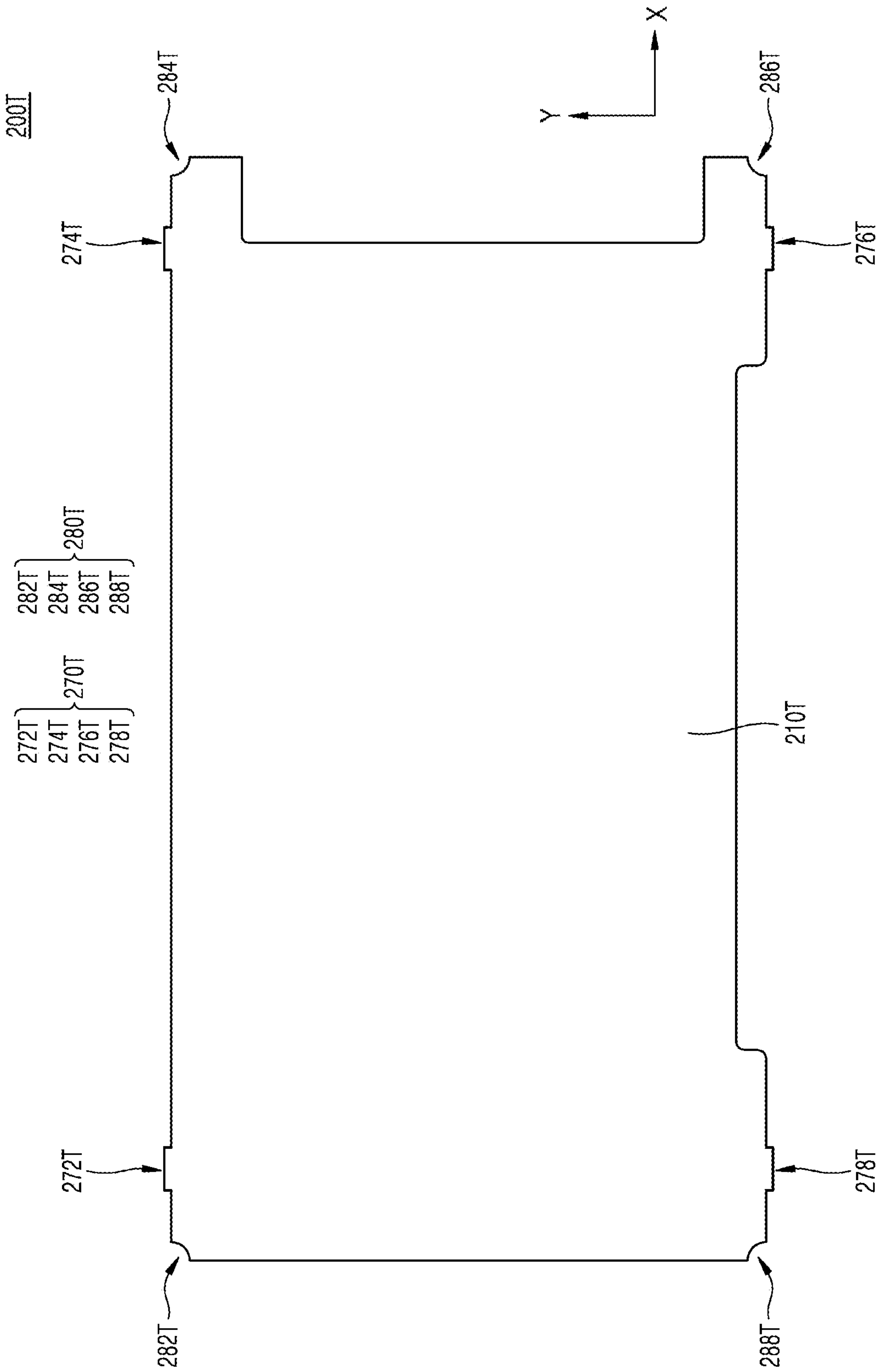
Figure 2D:
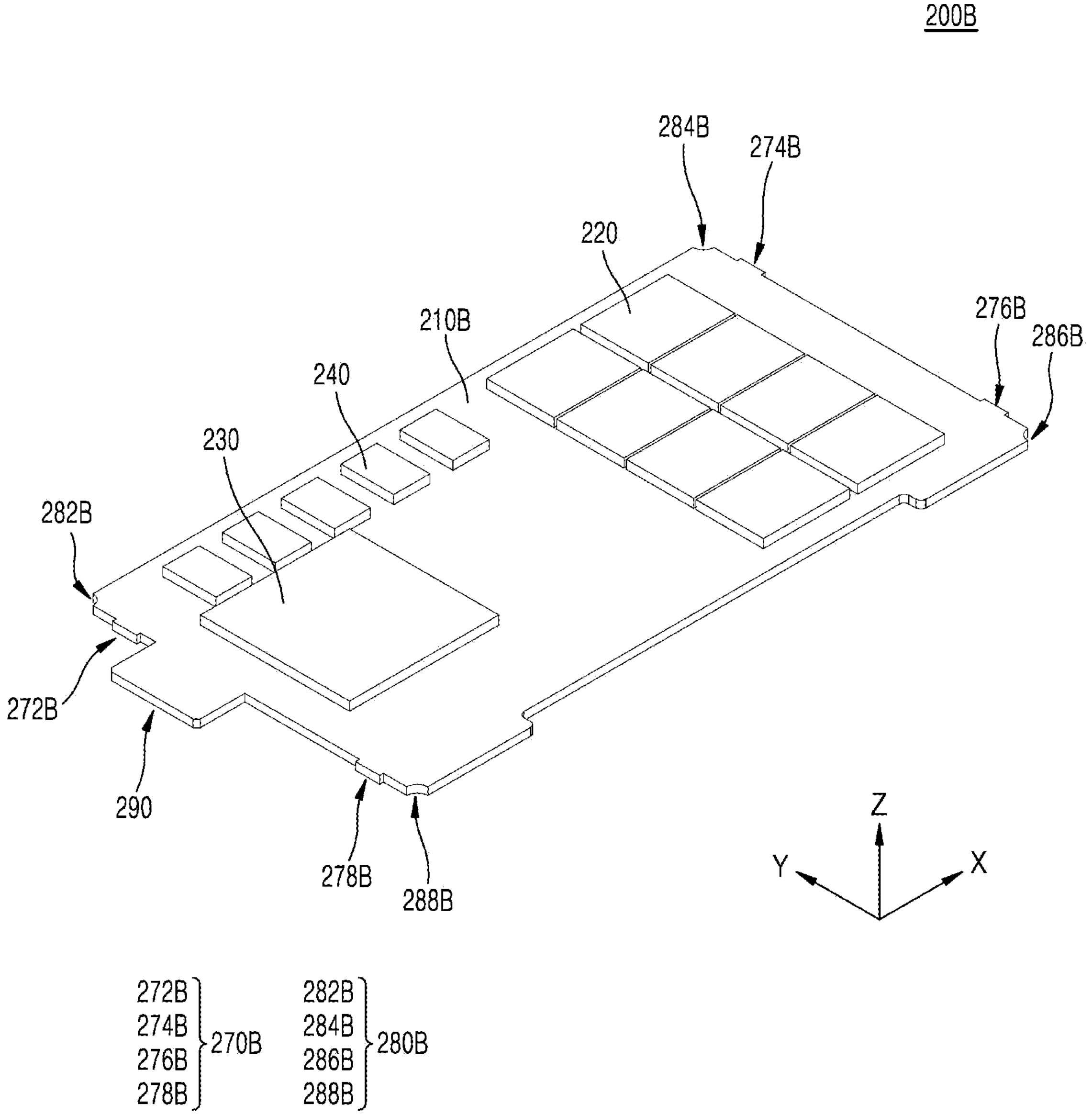
Figure 2E:
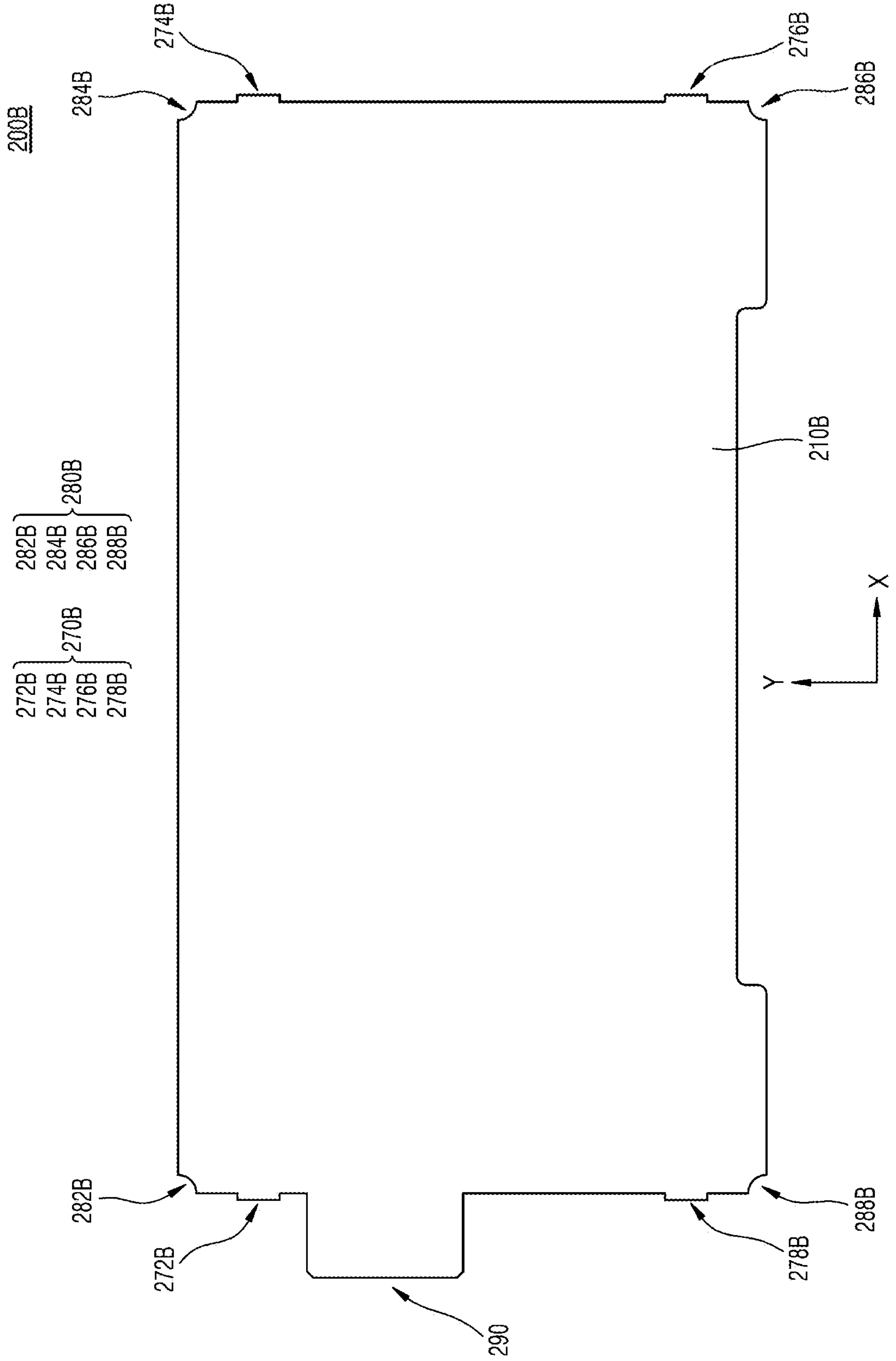

FIGS. 2A to 2E are perspective views and plan views illustrating the plurality of package substrate modules 200 of a solid state drive apparatus according to an some example embodiments. Particularly, FIG. 2A is a perspective view illustrating the plurality of package substrate modules 200 including the top package substrate module 200T and the bottom package substrate module 200B, FIG. 2B is a perspective view illustrating the top package substrate module 200T, FIG. 2C is a plan view of a top package base substrate 210T of the top package substrate module 200T, FIG. 2D is a perspective view illustrating the bottom package substrate module 200B, and FIG. 2E is a plan view of a bottom package base substrate 210B of the bottom package substrate module 200B.

Referring to FIGS. 2A to 2E, the plurality of package substrate modules 200 may include the top package substrate module 200T and the bottom package substrate module 200B. The top package substrate module 200T and the bottom package substrate module 200B may be in the internal space of the housing 100 to be separated from each other in the vertical direction (the Z direction). In some example embodiments, the top package substrate module 200T may include the top package base substrate 210T and a plurality of first semiconductor chips 220 mounted on the top package base substrate 210T, and the bottom package substrate module 200B may include the bottom package base substrate 210B and a plurality of first semiconductor chips 220, at least one second semiconductor chip 230, and a plurality of third semiconductor chips 240 mounted on the bottom package base substrate 210B, but the top package substrate module 200T and the bottom package substrate module 200B are not limited thereto. For example, some and the other some of the plurality of first semiconductor chips 220, the at least one second semiconductor chip 230, and the plurality of third semiconductor chips 240 may be mounted on the top package base substrate 210T and the bottom package base substrate 210B, respectively. The plurality of first semiconductor chips 220, the at least one second semiconductor chip 230, and the plurality of third semiconductor chips 240 may be referred to as a plurality of semiconductor chips. Semiconductor chips mounted on the top package base substrate 210T among the plurality of first semiconductor chips 220, the at least one second semiconductor chip 230, and the plurality of third semiconductor chips 240 may be referred to as upper semiconductor chips. Semiconductor chips mounted on the bottom package base substrate 210B among the plurality of first semiconductor chips 220, the at least one second semiconductor chip 230, and the plurality of third semiconductor chips 240 may be referred to as lower semiconductor chips.

Each of the top package substrate module 200T and the bottom package substrate module 200B may be a dual in-lined memory module (DIMM) having some and the other some of the plurality of first semiconductor chips 220, the at least one second semiconductor chip 230, and the plurality of third semiconductor chips 240 respectively mounted on the top surface and the bottom surface of each of the top package base substrate 210T and the bottom package base substrate 210B, but is not limited thereto. For example, each of the top package substrate module 200T and the bottom package substrate module 200B may be a single in-lined memory module (SIMM) having some and the other some of the plurality of first semiconductor chips 220, the at least one second semiconductor chip 230, and the plurality of third semiconductor chips 240 mounted on the top surface of each of the top package base substrate 210T and the bottom package base substrate 210B. Alternatively, for example, one of the top package substrate module 200T and the bottom package substrate module 200B may be a DIMM and the other one thereof may be a SIMM.

A scheme in which each of the plurality of first semiconductor chips 220, the at least one second semiconductor chip 230, and the plurality of third semiconductor chips 240 is mounted on any one of the top package base substrate 210T and the bottom package base substrate 210B may be a ball grid array (BGA) scheme, a pin grid array (PGA) scheme, a tape carrier package (TCP) scheme, a chip-on-board (COB) scheme, a quad flat non-leaded (QFN) scheme, a quad flat package (QFP) scheme, or the like, but is not limited thereto.

Each of the plurality of first semiconductor chips 220, the at least one second semiconductor chip 230, and the plurality of third semiconductor chips 240 may include a semiconductor substrate. The semiconductor substrate may include silicon (Si). Alternatively, the semiconductor substrate may include a semiconductor element, such as germanium (Ge), or a compound semiconductor, such as silicon carbide (SiC), gallium arsenide (GaAs), indium arsenide (InAs), or indium phosphide (InP). The semiconductor substrate may have an active surface and an inactive surface opposite to the active surface. Each of the plurality of first semiconductor chips 220, the at least one second semiconductor chip 230, and the plurality of third semiconductor chips 240 may have a semiconductor device including various kinds of individual devices formed on the active surface.

The at least one second semiconductor chip 230 may control the plurality of first semiconductor chips 220 and the plurality of third semiconductor chips 240. A controller may be embedded in the at least one second semiconductor chip 230. The controller may control access to data stored in the plurality of first semiconductor chips 220 and the plurality of third semiconductor chips 240. The controller may control a write/read operation on the plurality of first semiconductor chips 220, e.g., flash memory, in response to a control command of an external host. The controller may include a separate control semiconductor chip, such as an application specific integrated circuit (ASIC). The controller may be designed to be automatically executed by an operating system of the external host, for example, when the solid state drive apparatus 1 is connected to the external host. The controller may provide a standard protocol, such as a PATA protocol, a SATA protocol, a SCSI protocol, or a PCIe protocol. Also, the controller may perform wear leveling, garbage collection, bad block management, and error correcting code (ECC) on the plurality of first semiconductor chips 220. In some example embodiments, the controller may include a script for automatic execution and an application program executable by the external host.

Each of the plurality of first semiconductor chips 220 may be a nonvolatile memory device. The nonvolatile memory device may include, for example, flash memory, phase-change random access memory (PRAM), resistive random access memory (RRAM), ferroelectric random access memory (FeRAM), magnetic random access memory (MRAM), or the like, but is not limited thereto. The flash memory may be, for example, NAND flash memory. The flash memory may be, for example, vertical NAND (V-NAND) flash memory. The nonvolatile memory device may include a single semiconductor die or a plurality of semiconductor dies that are stacked.

Each of the plurality of third semiconductor chips 240 may be a volatile memory device. The volatile memory device may include, for example, dynamic random access memory (DRAM), static random access memory (SRAM), synchronous dynamic random access memory (SDRAM), double data rate random access memory (DDR RAM), Rambus® dynamic random access memory (RDRAM), or the like, but is not limited thereto. The volatile memory device may provide a cache function of storing data frequently used when the external host accesses the solid state drive apparatus 1, thereby scaling an access time and a data transfer performance to meet the process performance of the external host connected to the solid state drive apparatus 1.

In some example embodiments, the plurality of package substrate modules 200 may further include at least one passive device 250. For example, the at least one passive device 250 may include a capacitor. In some example embodiments, the at least one passive device 250 may be attached to the top package base substrate 210T, but is not limited thereto. For example, the at least one passive device 250 may be attached to the bottom package base substrate 210B or to each of the top package base substrate 210T and the bottom package base substrate 210B.

In some example embodiments, each of the top package base substrate 210T and the bottom package base substrate 210B may be a printed circuit board (PCB). For example, each of the top package base substrate 210T and the bottom package base substrate 210B may be a double-sided PCB or a multi-layer PCB. Each of the top package base substrate 210T and the bottom package base substrate 210B may include a substrate base. The substrate base may be made of at least one material selected from among a phenol resin, an epoxy resin, and polyimide. The substrate base may include at least one material selected from among, for example, frame retardant 4 (FR4), tetrafunctional epoxy, polyphenylene ether, epoxy/polyphenylene oxide, bismaleimide triazine (BT), Thermount® (a nonwoven aramid fiber reinforced substrate for printed wiring boards), cyanate ester, polyimide, and a liquid crystal polymer.

Each of the top package base substrate 210T and the bottom package base substrate 210B may have a wiring pattern formed on the top surface and the bottom surface of the substrate base. In some example embodiments, when the substrate base includes a plurality of layers, the wiring pattern may also be formed between every two of the plurality of layers included in the substrate base. Each of the top package base substrate 210T and the bottom package base substrate 210B may have a conductive via formed to connect wiring patterns to each other in the substrate base. The conductive via may electrically connect the wiring patterns to each other by penetrating the entirety or a portion of the substrate base. The wiring pattern and/or the conductive via may include Cu, nickel, stainless steel, or beryllium Cu.

A solder resist layer covering at least a portion of each of the wiring patterns on the top surface and the bottom surface of the substrate base may be formed on the top surface and the bottom surface of each of the top package base substrate 210T and the bottom package base substrate 210B. A portion of each of the wiring patterns on the top surface and the bottom surface of the substrate base, which is not covered by the solder resist layer, may be used as a pad electrically connected to the plurality of first semiconductor chips 220, the at least one second semiconductor chip 230, the plurality of third semiconductor chips 240, an active device, or a passive device on the top surface and/or the bottom surface of each of the top package base substrate 210T and the bottom package base substrate 210B.

The plurality of package substrate modules 200 may include the external connector 290. In some example embodiments, the bottom package substrate module 200B may include the external connector 290, but is not limited thereto. For example, instead of the bottom package substrate module 200B, the top package substrate module 200T may include the external connector 290.

The at least one passive device 250 and the external connector 290 may be at one side and the other side of the plurality of package substrate modules 200, respectively. In some example embodiments, the at least one passive device 250 may be at the second edge EG2 of the top package substrate module 200T, and the external connector 290 may be at the fourth edge EG4 of the bottom package substrate module 200B, but the at least one passive device 250 and the external connector 290 are not limited thereto. For example, the at least one passive device 250 may be at the second edge EG2 of the top package substrate module 200T and the external connector 290 may be at the fourth edge EG4 of the top package substrate module 200T, the at least one passive device 250 may be at the second edge EG2 of the bottom package substrate module 200B and the external connector 290 may be at the fourth edge EG4 of the bottom package substrate module 200B, or the at least one passive device 250 may be at the second edge EG2 of the bottom package substrate module 200B and the external connector 290 may be at the fourth edge EG4 of the top package substrate module 200T.

The top package substrate module 200T may be electrically connected to the bottom package substrate module 200B by a connection member 295. One end and the other end of the connection member 295 may be connected to the top package base substrate 210T and the bottom package base substrate 210B, respectively. For example, when the bottom package substrate module 200B includes the external connector 290, some mounted on the top package base substrate 210T among the plurality of first semiconductor chips 220, the at least one second semiconductor chip 230, and the plurality of third semiconductor chips 240 may be electrically connected to the external connector 290 through the connection member 295 and the bottom package base substrate 210B. In some example embodiments, the plurality of package substrate modules 200 may include a rigid-flexible PCB (RF-PCB), and the connection member 295 may include a flexible printed circuitry (FPC) connector, but the plurality of package substrate modules 200 and the connection member 295 are not limited thereto. For example, the connection member 295 may include a board-to-board (BtoB) connector or a flat flexible cable (FFC) connector between the top package substrate module 200T and the bottom package substrate module 200B.

The top package base substrate 210T may include a plurality of top protrusions 270T and a plurality of top notches 280T, and the bottom package base substrate 210B may include a plurality of bottom protrusions 270B and a plurality of bottom notches 280B. In some example embodiments, each of the numbers of top protrusions 270T and bottom protrusions 270B may be 4, but is not limited thereto. For example, each of the numbers of top protrusions 270T and bottom protrusions 270B may be 2 or greater. In some example embodiments, each of the numbers of top notches 280T and bottom notches 280B may be 4, but is not limited thereto. For example, each of the numbers of top notches 280T and bottom notches 280B may be 4 or greater.

The plurality of top protrusions 270T may include a first top protrusion 272T, a second top protrusion 274T, a third top protrusion 276T, and a fourth top protrusion 278T. The first top protrusion 272T and the second top protrusion 274T may be at the first edge EG1 of the top package base substrate 210T to be separated from each other, and the third top protrusion 276T and the fourth top protrusion 278T may be at the third edge EG3 of the top package base substrate 210T to be separated from each other. The plurality of top notches 280T may include a first top notch 282T, a second top notch 284T, a third top notch 286T, and a fourth top notch 288T respectively at the first corner CN1, the second corner CN2, the third corner CN3, and the fourth corner CN4 of the top package base substrate 210T. The plurality of bottom protrusions 270B may include a first bottom protrusion 272B, a second bottom protrusion 274B, a third bottom protrusion 276B, and a fourth bottom protrusion 278B. The first bottom protrusion 272B and the fourth bottom protrusion 278B may be at the fourth edge EG4 of the bottom package base substrate 210B to be separated from each other, and the second bottom protrusion 274B and the third bottom protrusion 276B may be at the second edge EG2 of the bottom package base substrate 210B to be separated from each other. The first bottom protrusion 272B, the second bottom protrusion 274B, the third bottom protrusion 276B, and the fourth bottom protrusion 278B may be adjacent to the first corner CN1, the second corner CN2, the third corner CN3, and the fourth corner CN4 of the bottom package base substrate 210B, respectively. The plurality of bottom notches 280B may include a first bottom notch 282B, a second bottom notch 284B, a third bottom notch 286B, and a fourth bottom notch 288B respectively at the first corner CN1, the second corner CN2, the third corner CN3, and the fourth corner CN4 of the bottom package base substrate 210B.

In some example embodiments, the first top protrusion 272T, the second top protrusion 274T, the third top protrusion 276T, and the fourth top protrusion 278T may not overlap the first bottom protrusion 272B, the second bottom protrusion 274B, the third bottom protrusion 276B, and the fourth bottom protrusion 278B in the vertical direction (the Z direction), respectively. That is, the first top protrusion 272T, the second top protrusion 274T, the third top protrusion 276T, and the fourth top protrusion 278T may be separated from the first bottom protrusion 272B, the second bottom protrusion 274B, the third bottom protrusion 276B, and the fourth bottom protrusion 278B in a plan view, respectively. The first top notch 282T, the second top notch 284T, the third top notch 286T, and the fourth top notch 288T may overlap the first bottom notch 282B, the second bottom notch 284B, the third bottom notch 286B, and the fourth bottom notch 288B in the vertical direction (the Z direction), respectively.

Figure 3A:
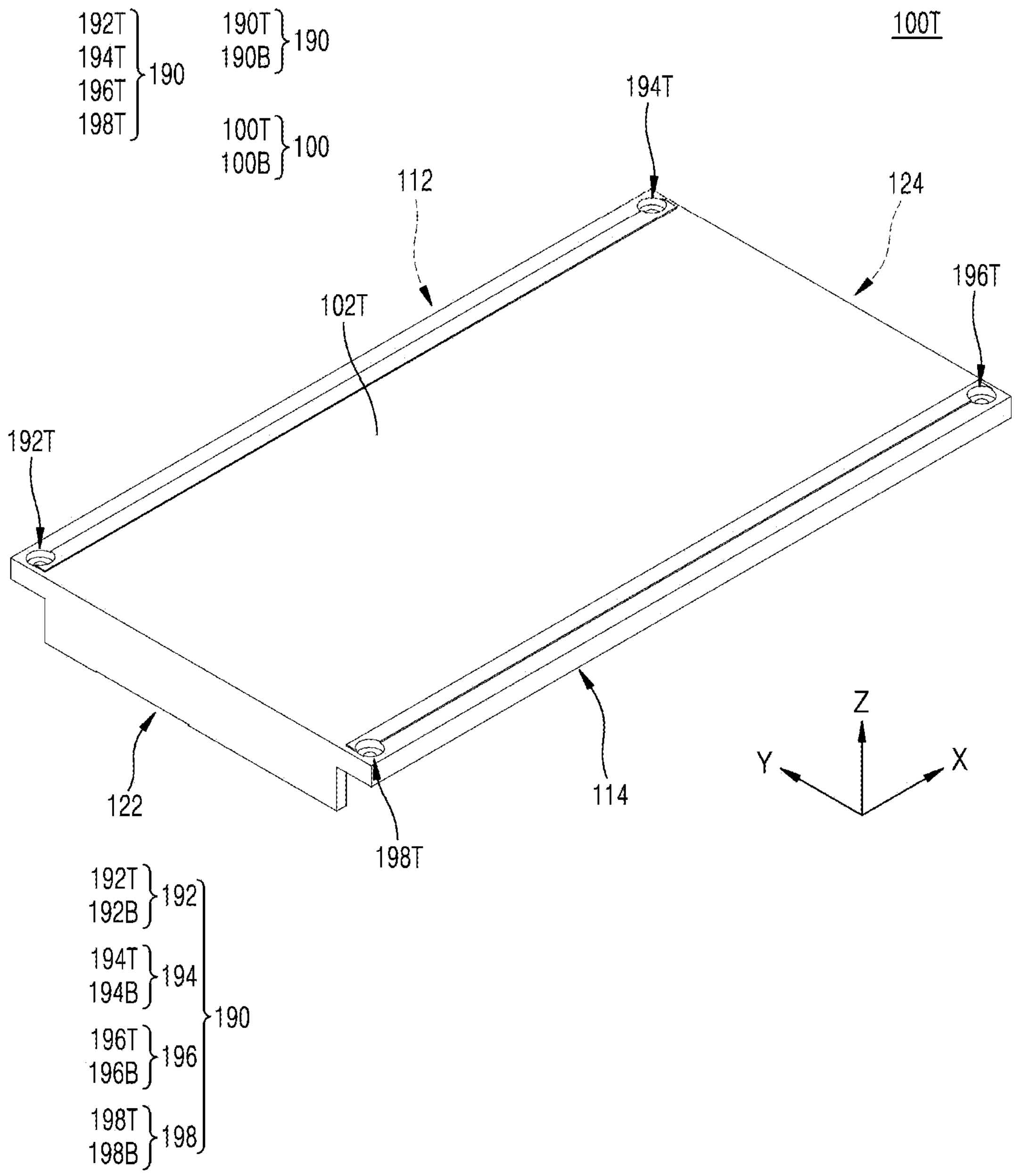
FIGS. 3A, 3B, 3C and 3D are perspective views, a magnified perspective view, and a plan view illustrating a top cover of a housing of a solid state drive apparatus according to some example embodiments of the inventive concepts.
Figure 3B:
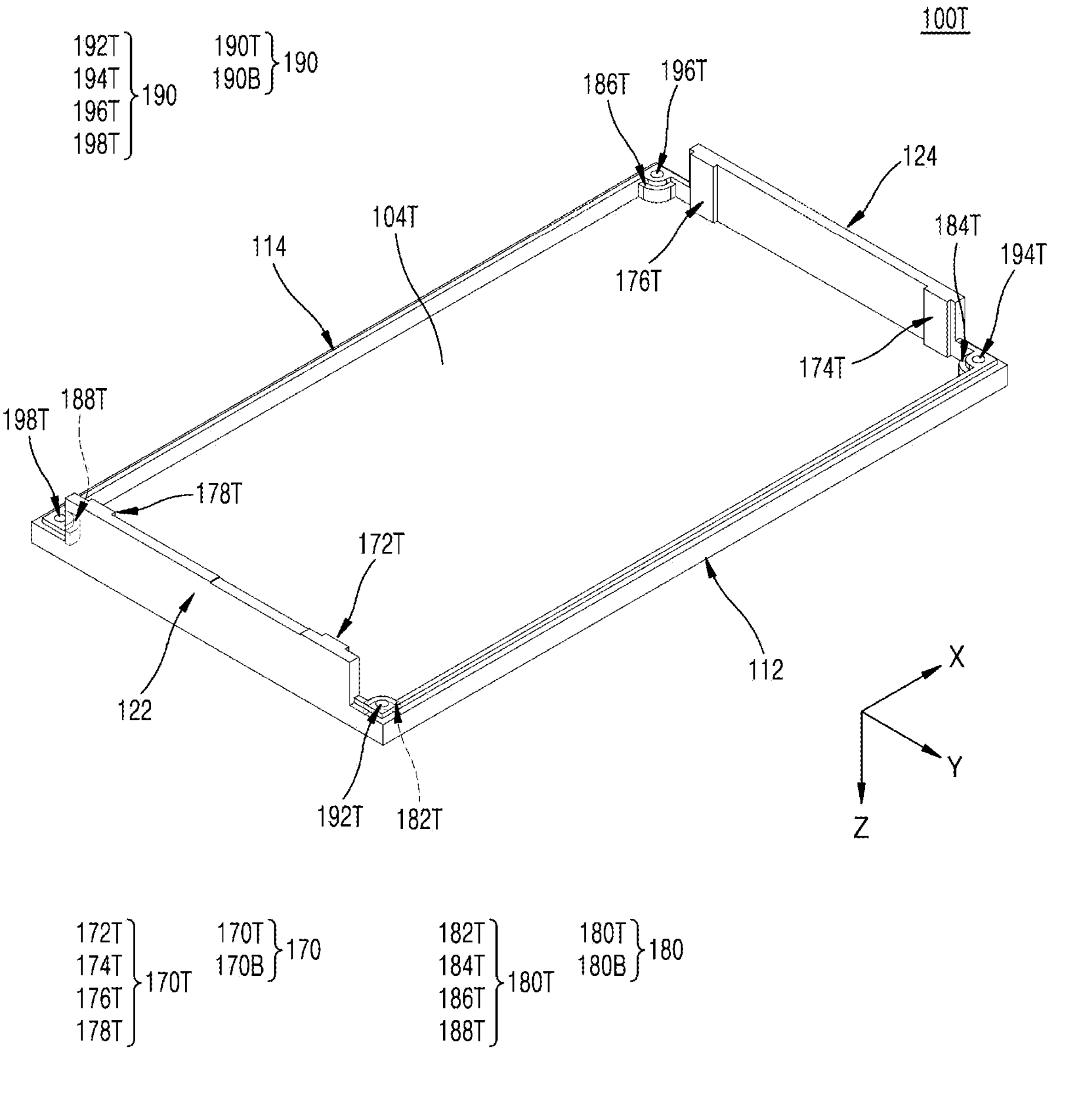
Figure 3C:
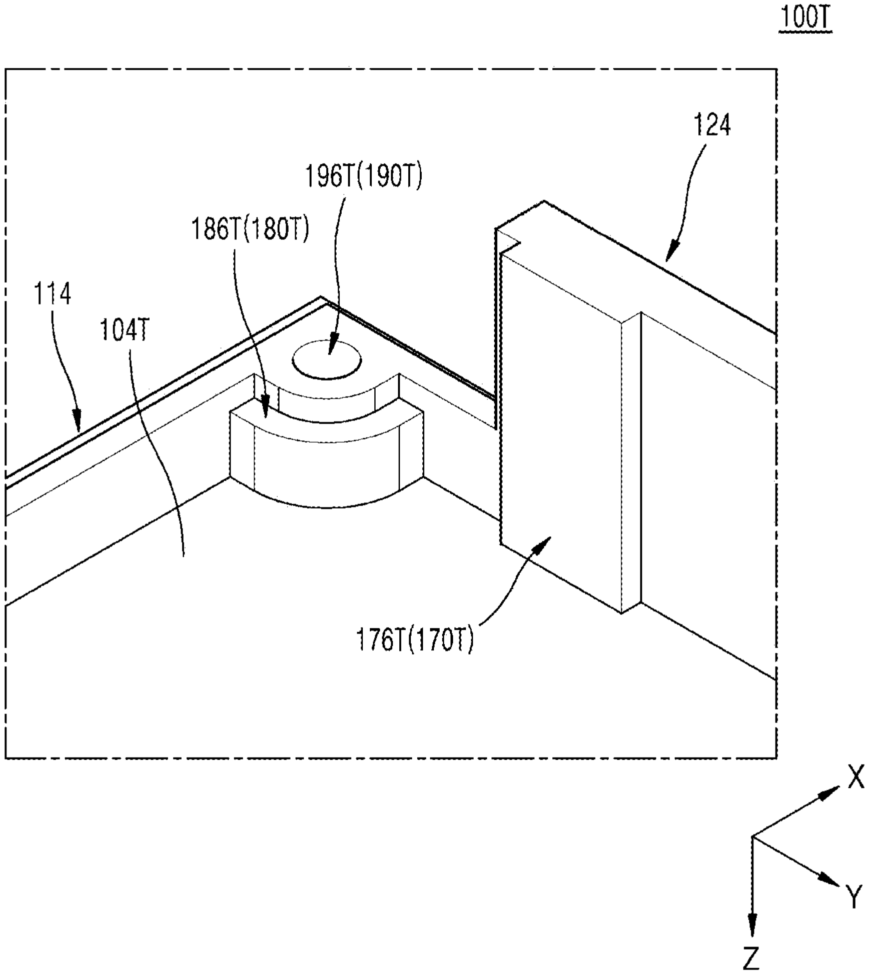
Figure 3D:
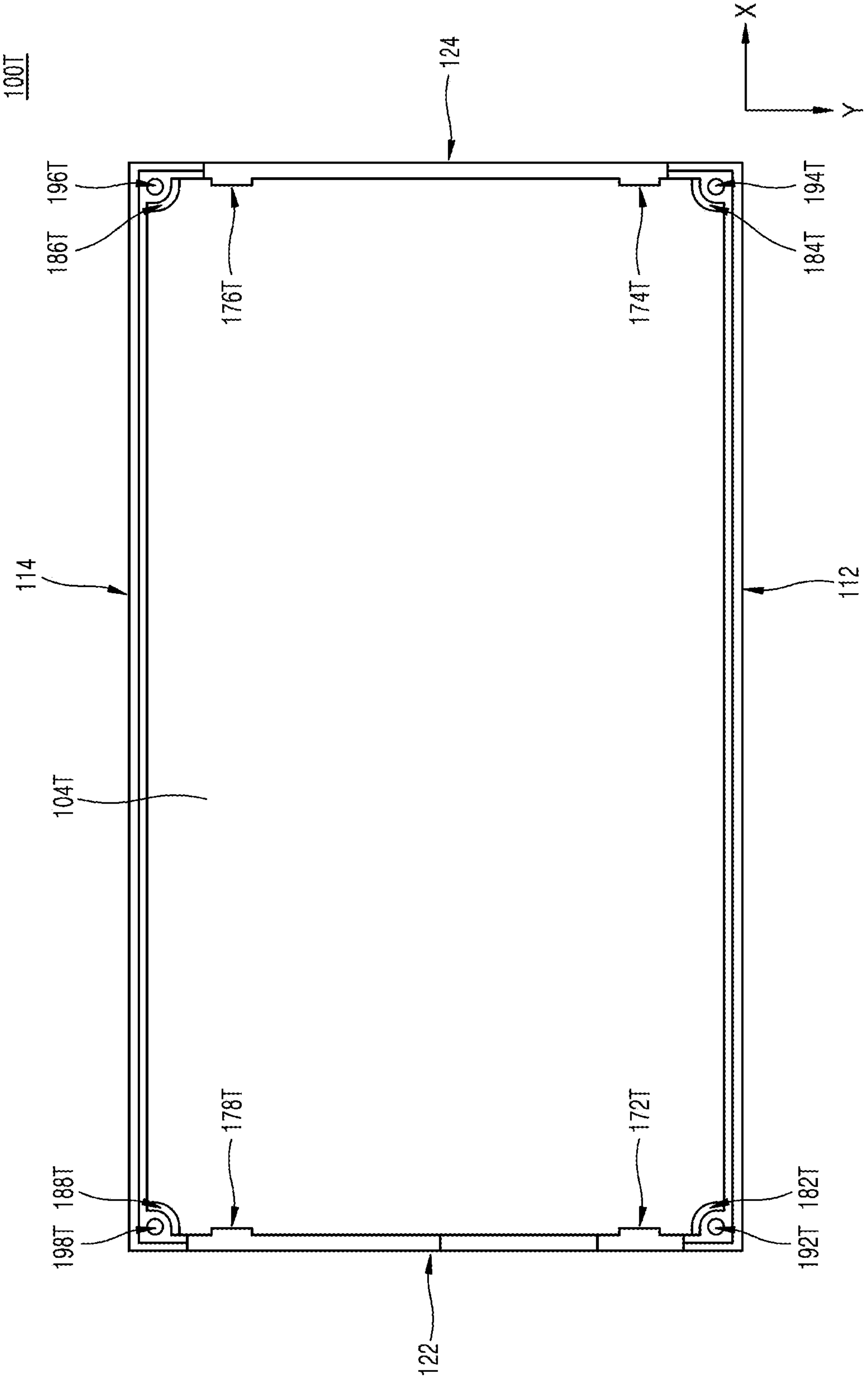
Figure 4A:
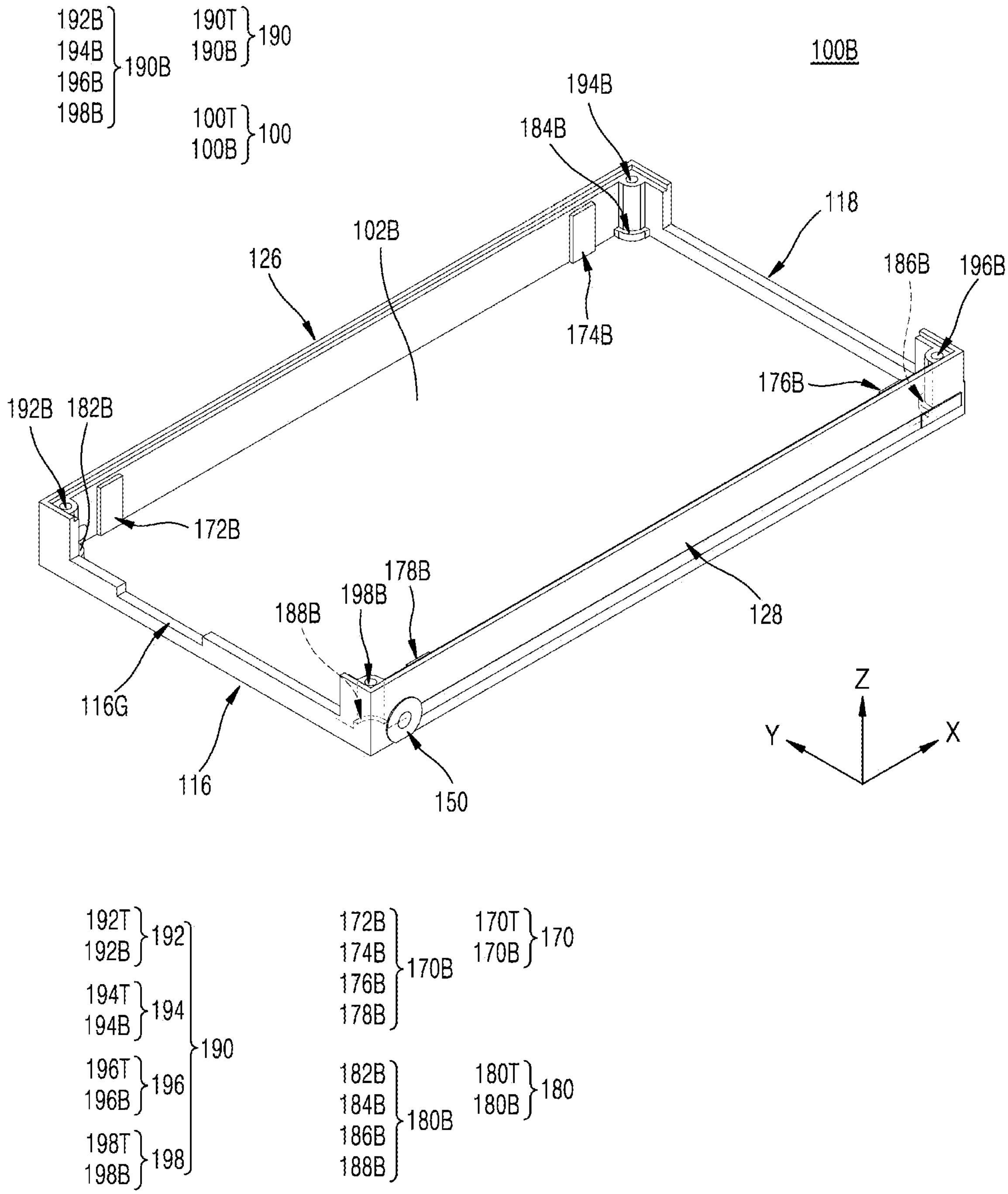
FIGS. 4A, 4B, 4C and 4D are perspective views, a magnified perspective view, and a plan view illustrating a bottom cover of a housing of a solid state drive apparatus according to some example embodiments of the inventive concepts.
Figure 4B:
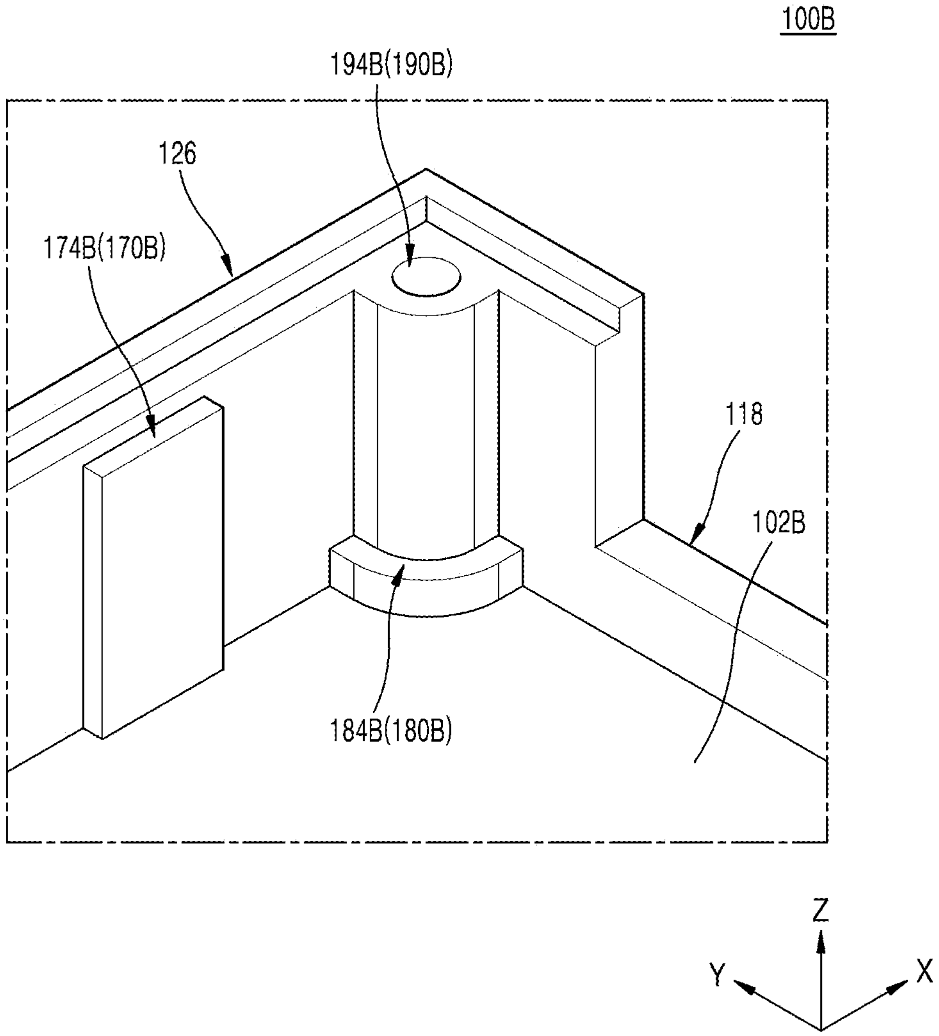
Figure 4C:
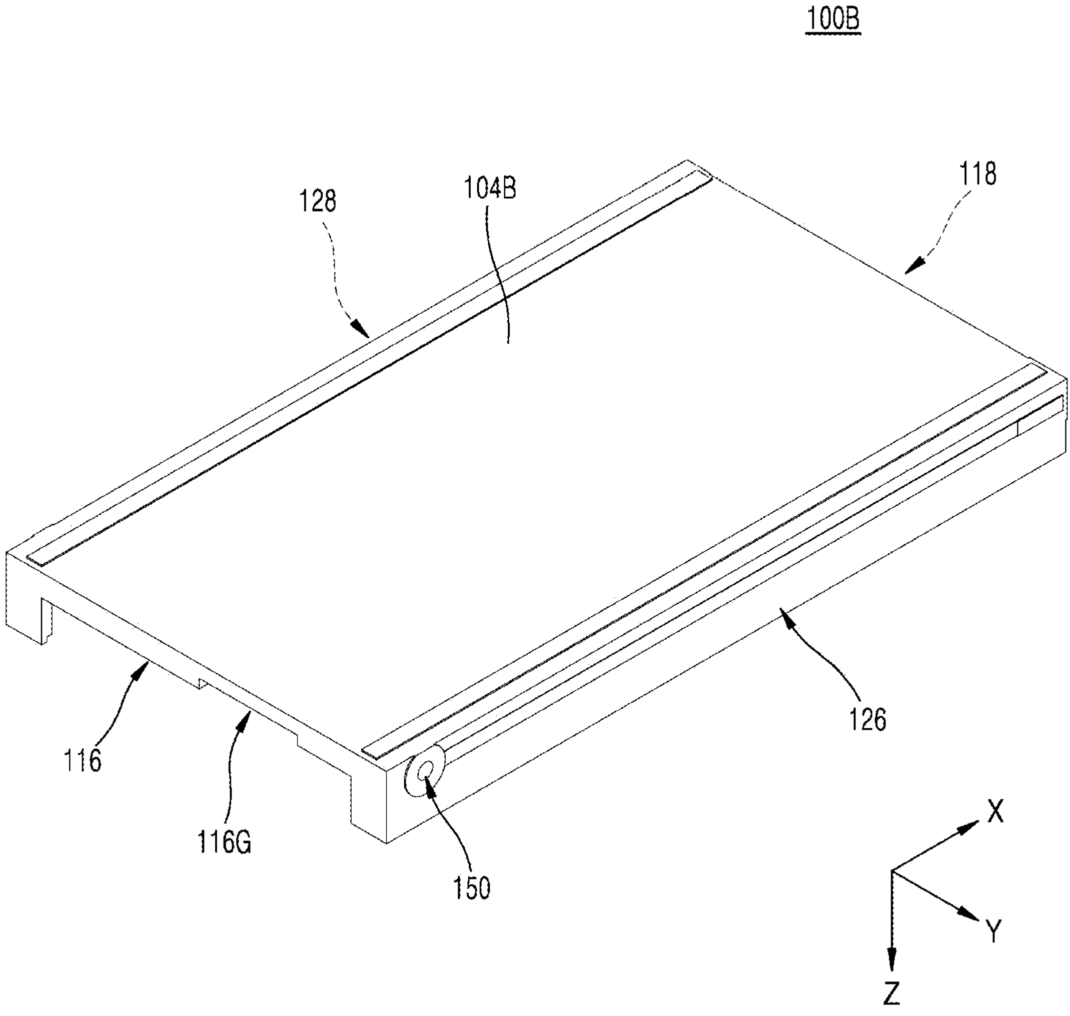
Figure 4D:
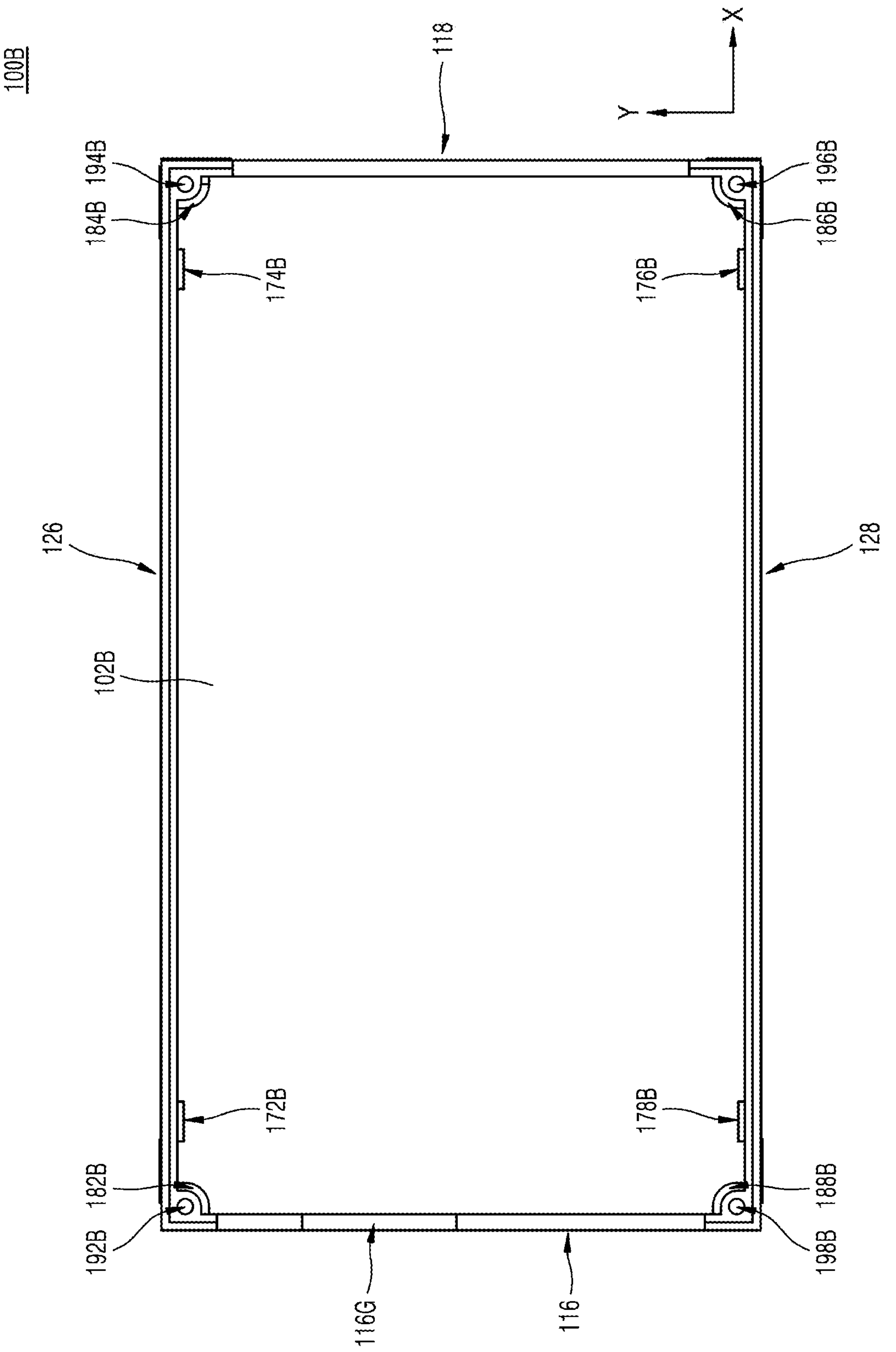

FIGS. 3A to 3D are perspective views, a magnified perspective view, and a plan view illustrating the top cover 100T of the housing 100 of a solid state drive apparatus according to some example embodiments, and FIGS. 4A to 4D are perspective views, a magnified perspective view, and a plan view illustrating the bottom cover 100B of the housing 100 of a solid state drive apparatus according to some example embodiments. Particularly, FIGS. 3A and 3B are perspective views of the top cover 100T from the top and the bottom, respectively, FIG. 3C is a magnified perspective view illustrating a portion of the top cover 100T in FIG. 3B, FIG. 3D is a plan view of the top cover 100T from the bottom, FIGS. 4A and 4C are perspective views of the bottom cover 100B from the top and the bottom, respectively, FIG. 4B is a magnified perspective view illustrating a portion of the bottom cover 100B in FIG. 4A, and FIG. 4D is a plan view of the bottom cover 100B from the top.

Referring to FIGS. 3A to 4D, the housing 100 may include the top cover 100T and the bottom cover 100B. The top cover 100T may have the first top surface 102T and the first bottom surface 104T that are opposite to each other, and the bottom cover 100B may have the second top surface 102B and the second bottom surface 104B that are opposite to each other. In the top cover 100T and the bottom cover 100B that are coupled to each other, the first top surface 102T of the top cover 100T and the second top surface 102B of the bottom cover 100B may be oriented in the same direction, e.g., the vertical direction (the Z direction), and the first bottom surface 104T of the top cover 100T and the second bottom surface 104B of the bottom cover 100B may be oriented in the same direction, e.g., the reverse direction of the vertical direction (the Z direction). The first top surface 102T and the second bottom surface 104B may face the outside of the housing 100, and the first bottom surface 104T and the second top surface 102B may face the internal space of the housing 100.

The top cover 100T may include a first top lower sidewall 112 and a second top lower sidewall 114 that face each other, and a first top higher sidewall 122 and a second top higher sidewall 124 that face each other. The bottom cover 100B may include a first bottom higher sidewall 126 and a second bottom higher sidewall 128 that face each other, and a first bottom lower sidewall 116 and a second bottom lower sidewall 118 that face each other. From the bottom surface 104T of the top cover 100T in the reverse direction of the vertical direction (the Z direction), the height of each of the first top lower sidewall 112 and the second top lower sidewall 114 may be less than the height of each of the first top higher sidewall 122 and the second top higher sidewall 124. From the top surface 102B of the bottom cover 100B in the vertical direction (the Z direction), the height of each of the first bottom lower sidewall 116 and the second bottom lower sidewall 118 may be less than the height of each of the first bottom higher sidewall 126 and the second bottom higher sidewall 128.

In the top cover 100T and the bottom cover 100B that are coupled to each other, the first top lower sidewall 112, the second top lower sidewall 114, the first top higher sidewall 122, and the second top higher sidewall 124 of the top cover 100T may correspond to the first bottom higher sidewall 126, the second bottom higher sidewall 128, the first bottom lower sidewall 116, and the second bottom lower sidewall 118 of the bottom cover 100B, respectively. For example, one side of each of the first top lower sidewall 112, the second top lower sidewall 114, the first top higher sidewall 122, and the second top higher sidewall 124 of the top cover 100T connected to the first bottom surface 104T and the other side opposite to the one side may be in contact with one side of each of the first bottom higher sidewall 126, the second bottom higher sidewall 128, the first bottom lower sidewall 116, and the second bottom lower sidewall 118 of the bottom cover 100B connected to the second top surface 102B and the other side opposite to the one side, respectively.

The first top lower sidewall 112 and the first bottom higher sidewall 126 may be at the first edge EG1 of the housing 100, the second top higher sidewall 124 and the second bottom lower sidewall 118 may be at the second edge EG2 of the housing 100, the second top lower sidewall 114 and the second bottom higher sidewall 128 may be at the third edge EG3 of the housing 100, and the first top higher sidewall 122 and the first bottom lower sidewall 116 may be at the fourth edge EG4 of the housing 100. In a top view of the housing 100, the first top lower sidewall 112, the second top higher sidewall 124, the second top lower sidewall 114, and the first top higher sidewall 122 of the top cover 100T may be sequential clockwise, and the first bottom higher sidewall 126, the second bottom lower sidewall 118, the second bottom higher sidewall 128, and the first bottom lower sidewall 116 of the bottom cover 100B may be sequential clockwise. In some example embodiments, the first bottom lower sidewall 116 may have a connector groove 116G corresponding to the external connector 290 (see FIGS. 1A and 1B). From the top surface 102B of the bottom cover 100B in the vertical direction (the Z direction), the height of the connector groove 116G may be less than the height of the other portion of the first bottom lower sidewall 116.

The housing 100 may have the plurality of screw holes 190. The plurality of screw holes 190 may include the first screw hole 192, the second screw hole 194, the third screw hole 196, and the fourth screw hole 198. The top cover 100T may have a plurality of top screw holes 190T, and the bottom cover 100B may have a plurality of bottom screw holes 190B. The plurality of top screw holes 190T and the plurality of bottom screw holes 190B that correspond to each other may constitute the plurality of screw holes 190.

The plurality of top screw holes 190T may include a first top screw hole 192T, a second top screw hole 194T, a third top screw hole 196T, and a fourth top screw hole 198T. The plurality of bottom screw holes 190B may include a first bottom screw hole 192B, a second bottom screw hole 194B, a third bottom screw hole 196B, and a fourth bottom screw hole 198B. The first top screw hole 192T, the second top screw hole 194T, the third top screw hole 196T, and the fourth top screw hole 198T may be at the first corner CN1, the second corner CN2, the third corner CN3, and the fourth corner CN4 of the top cover 100T, respectively, and the first bottom screw hole 192B, the second bottom screw hole 194B, the third bottom screw hole 196B, and the fourth bottom screw hole 198B may be at the first corner CN1, the second corner CN2, the third corner CN3, and the fourth corner CN4 of the bottom cover 100B, respectively. In the top cover 100T and the bottom cover 100B that are coupled to each other, the first top screw hole 192T, the second top screw hole 194T, the third top screw hole 196T, and the fourth top screw hole 198T may communicate with the first bottom screw hole 192B, the second bottom screw hole 194B, the third bottom screw hole 196B, and the fourth bottom screw hole 198B to form the first screw hole 192, the second screw hole 194, the third screw hole 196, and the fourth screw hole 198, respectively.

The housing 100 may include a plurality of protruding bar portions 170 and a plurality of protruding round portions 180. The plurality of protruding bar portions 170 may include a plurality of protruding bar pressing portions 170T included in the top cover 100T and a plurality of protruding bar seating portions 170B included in the bottom cover 100B. The plurality of protruding round portions 180 may include a plurality of protruding round pressing portions 180T included in the top cover 100T and a plurality of protruding round seating portions 180B included in the bottom cover 100B. Each of the plurality of protruding round portions 180 may have a circular arc shape extending along the periphery of each of the plurality of screw holes 190 in a plan view.

The number of protruding bar pressing portions 170T may be the same as the number of bottom protrusions 270B shown in FIGS. 2D and 2E. The number of protruding bar seating portions 170B may be the same as the number of top protrusions 270T shown in FIGS. 2B and 2C. The number of protruding round pressing portions 180T may be the same as the number of top notches 280T shown in FIGS. 2B and 2C. The number of protruding round seating portions 180B may be the same as the number of bottom notches 280B shown in FIGS. 2D and 2E. In some example embodiments, each of the numbers of protruding bar pressing portions 170T and protruding bar seating portions 170B may be 4, but is not limited thereto. For example, each of the numbers of protruding bar pressing portions 170T and protruding bar seating portions 170B may be 2 or greater. In some example embodiments, each of the numbers of protruding round pressing portions 180T and protruding round seating portions 180B may be 4, but is not limited thereto. For example, each of the numbers of protruding round pressing portions 180T and protruding round seating portions 180B may be 4 or greater.

The plurality of protruding bar pressing portions 170T may include a first protruding bar pressing portion 172T, a second protruding bar pressing portion 174T, a third protruding bar pressing portion 176T, and a fourth protruding bar pressing portion 178T. The plurality of protruding round pressing portions 180T may include a first protruding round pressing portion 182T, a second protruding round pressing portion 184T, a third protruding round pressing portion 186T, and a fourth protruding round pressing portion 188T. The plurality of protruding bar seating portions 170B may include a first protruding bar seating portion 172B, a second protruding bar seating portion 174B, a third protruding bar seating portion 176B, and a fourth protruding bar seating portion 178B. The plurality of protruding round seating portions 180B may include a first protruding round seating portion 182B, a second protruding round seating portion 184B, a third protruding round seating portion 186B, and a fourth protruding round seating portion 188B.

The first protruding bar pressing portion 172T, the second protruding bar pressing portion 174T, the third protruding bar pressing portion 176T, and the fourth protruding bar pressing portion 178T may be at portions adjacent to the first corner CN1, the second corner CN2, the third corner CN3, and the fourth corner CN4 of the top cover 100T, respectively. For example, the first protruding bar pressing portion 172T may protrude toward the internal space of the housing 100 from the first top higher sidewall 122 adjacent to the first corner CN1 of the top cover 100T, the second protruding bar pressing portion 174T may protrude toward the internal space of the housing 100 from the second top higher sidewall 124 adjacent to the second corner CN2 of the top cover 100T, the third protruding bar pressing portion 176T may protrude toward the internal space of the housing 100 from the second top higher sidewall 124 adjacent to the third corner CN3 of the top cover 100T, and the fourth protruding bar pressing portion 178T may protrude toward the internal space of the housing 100 from the first top higher sidewall 122 adjacent to the fourth corner CN4 of the top cover 100T.

The first protruding round pressing portion 182T, the second protruding round pressing portion 184T, the third protruding round pressing portion 186T, and the fourth protruding round pressing portion 188T may protrude toward the internal space of the housing 100 from portions of the top cover 100T where the first top screw hole 192T, the second top screw hole 194T, the third top screw hole 196T, and the fourth top screw hole 198T are located, respectively.

The first protruding bar seating portion 172B, the second protruding bar seating portion 174B, the third protruding bar seating portion 176B, and the fourth protruding bar seating portion 178B may be at portions adjacent to the first corner CN1, the second corner CN2, the third corner CN3, and the fourth corner CN4 of the bottom cover 100B, respectively. For example, the first protruding bar seating portion 172B may protrude toward the internal space of the housing 100 from the first bottom higher sidewall 126 adjacent to the first corner CN1 of the bottom cover 100B, the second protruding bar seating portion 174B may protrude toward the internal space of the housing 100 from the first bottom higher sidewall 126 adjacent to the second corner CN2 of the bottom cover 100B, the third protruding bar seating portion 176B may protrude toward the internal space of the housing 100 from the second bottom higher sidewall 128 adjacent to the third corner CN3 of the bottom cover 100B, and the fourth protruding bar seating portion 178B may protrude toward the internal space of the housing 100 from the second bottom higher sidewall 128 adjacent to the fourth corner CN4 of the bottom cover 100B.

The first protruding round seating portion 182B, the second protruding round seating portion 184B, the third protruding round seating portion 186B, and the fourth protruding round seating portion 188B may protrude toward the internal space of the housing 100 from portions of the bottom cover 100B where the first bottom screw hole 192B, the second bottom screw hole 194B, the third bottom screw hole 196B, and the fourth bottom screw hole 198B are located, respectively.

The heights of the plurality of protruding bar pressing portions 170T including the first protruding bar pressing portion 172T, the second protruding bar pressing portion 174T, the third protruding bar pressing portion 176T, and the fourth protruding bar pressing portion 178T may be the same as each other. In some example embodiments, from the bottom surface 104T of the top cover 100T in the reverse direction of the vertical direction (the Z direction), the height of each of the plurality of protruding bar pressing portions 170T including the first protruding bar pressing portion 172T, the second protruding bar pressing portion 174T, the third protruding bar pressing portion 176T, and the fourth protruding bar pressing portion 178T may be the same as the height of each of the first top higher sidewall 122 and the second top higher sidewall 124.

The heights of the plurality of protruding round pressing portions 180T including the first protruding round pressing portion 182T, the second protruding round pressing portion 184T, the third protruding round pressing portion 186T, and the fourth protruding round pressing portion 188T may be the same as each other. In some example embodiments, from the bottom surface 104T of the top cover 100T in the reverse direction of the vertical direction (the Z direction), the height of each of the plurality of protruding round pressing portions 180T including the first protruding round pressing portion 182T, the second protruding round pressing portion 184T, the third protruding round pressing portion 186T, and the fourth protruding round pressing portion 188T may be less than the height of each of the first top lower sidewall 112 and the second top lower sidewall 114.

The heights of the plurality of protruding bar seating portions 170B including the first protruding bar seating portion 172B, the second protruding bar seating portion 174B, the third protruding bar seating portion 176B, and the fourth protruding bar seating portion 178B may be the same as each other. In some example embodiments, from the top surface 102B of the bottom cover 100B in the vertical direction (the Z direction), the height of each of the plurality of protruding bar seating portions 170B including the first protruding bar seating portion 172B, the second protruding bar seating portion 174B, the third protruding bar seating portion 176B, and the fourth protruding bar seating portion 178B may be less than the height of each of the first bottom higher sidewall 126 and the second bottom higher sidewall 128.

The heights of the plurality of protruding round seating portions 180B including the first protruding round seating portion 182B, the second protruding round seating portion 184B, the third protruding round seating portion 186B, and the fourth protruding round seating portion 188B may be the same as each other. In some example embodiments, from the top surface 102B of the bottom cover 100B in the vertical direction (the Z direction), the height of each of the plurality of protruding round seating portions 180B including the first protruding round seating portion 182B, the second protruding round seating portion 184B, the third protruding round seating portion 186B, and the fourth protruding round seating portion 188B may be less than the height of each of the first bottom lower sidewall 116 and the second bottom lower sidewall 118.

The first protruding bar pressing portion 172T, the second protruding bar pressing portion 174T, the third protruding bar pressing portion 176T, and the fourth protruding bar pressing portion 178T may not overlap the first protruding bar seating portion 172B, the second protruding bar seating portion 174B, the third protruding bar seating portion 176B, and the fourth protruding bar seating portion 178B in the vertical direction (the Z direction), respectively.

The first protruding round pressing portion 182T, the second protruding round pressing portion 184T, the third protruding round pressing portion 186T, and the fourth protruding round pressing portion 188T may overlap the first protruding round seating portion 182B, the second protruding round seating portion 184B, the third protruding round seating portion 186B, and the fourth protruding round seating portion 188B in the vertical direction (the Z direction), respectively. In the top cover 100T and the bottom cover 100B that are coupled to each other, the first protruding round pressing portion 182T, the second protruding round pressing portion 184T, the third protruding round pressing portion 186T, and the fourth protruding round pressing portion 188T may not be in contact with, e.g., may be separated from, the first protruding round seating portion 182B, the second protruding round seating portion 184B, the third protruding round seating portion 186B, and the fourth protruding round seating portion 188B, respectively.

Figure 5A:
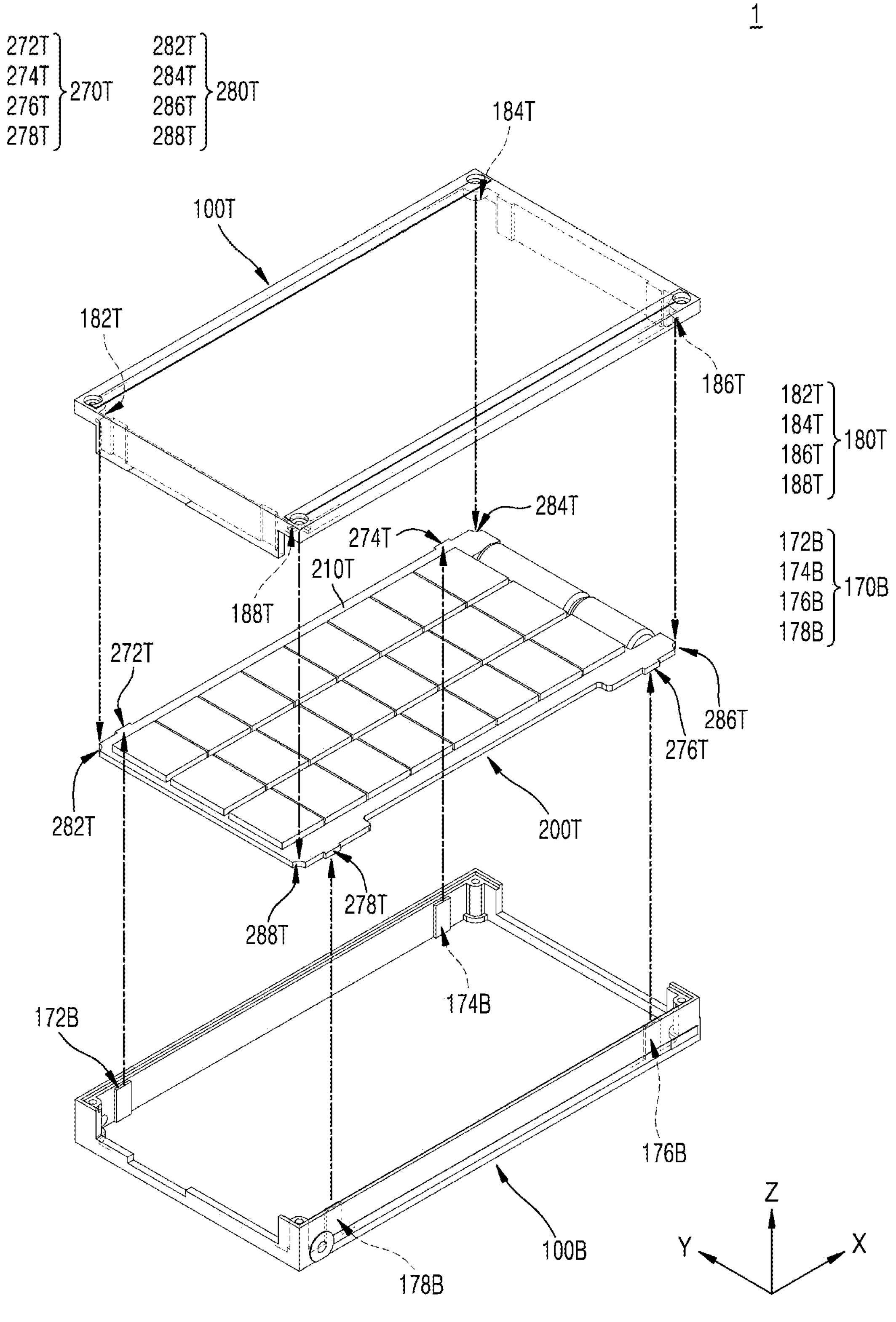
FIGS. 5A and 5B are exploded perspective views illustrating a solid state drive apparatus according to some example embodiments of the inventive concepts.
Figure 5B:
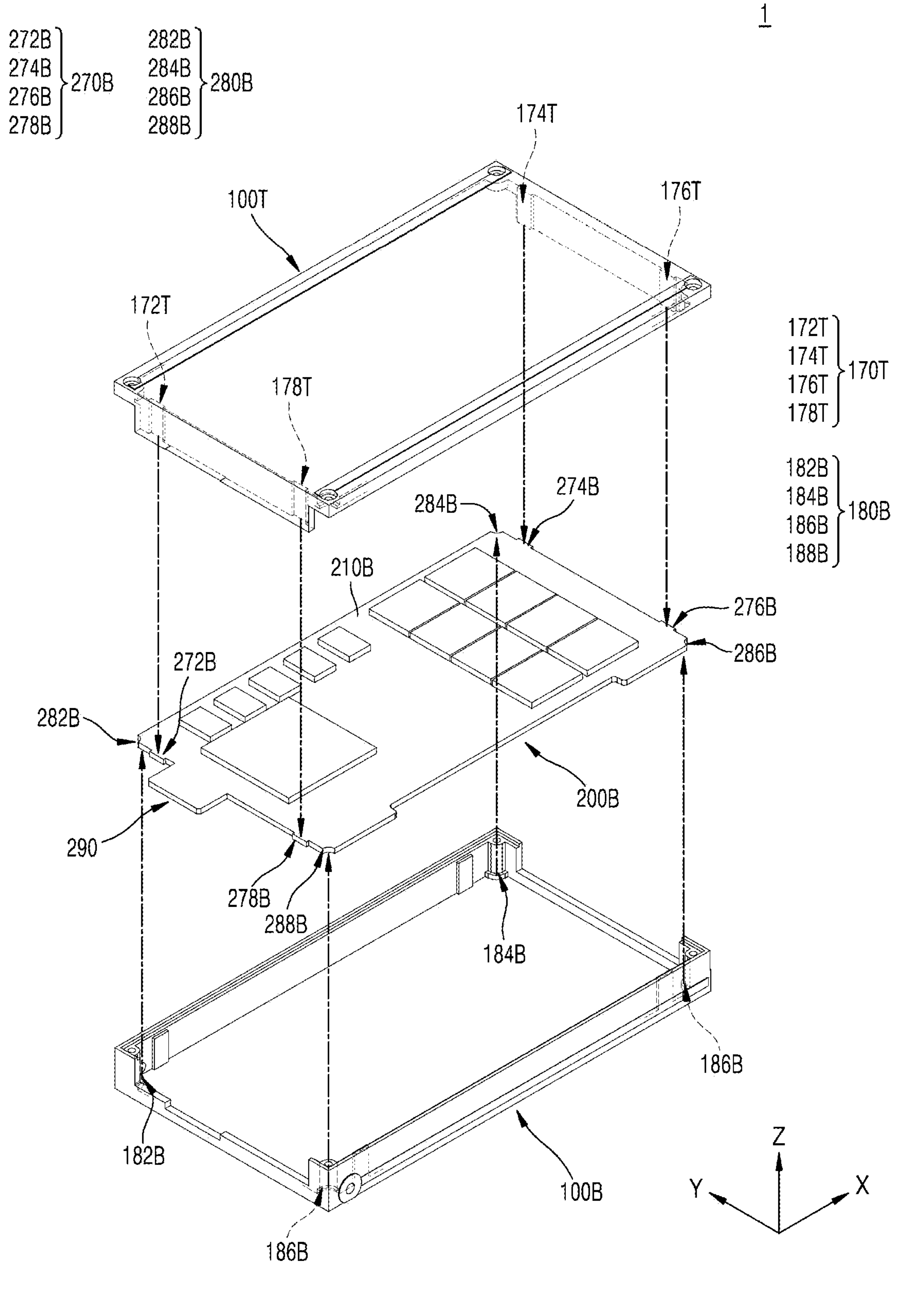

FIGS. 5A and 5B are exploded perspective views illustrating the solid state drive apparatus 1 according to some example embodiments. Particularly, FIG. 5A is an exploded perspective view illustrating the top cover 100T and the bottom cover 100B of a housing, and the top package substrate module 200T, and FIG. 5B is an exploded perspective view illustrating the top cover 100T and the bottom cover 100B of a housing, and the bottom package substrate module 200B.

Referring to FIGS. 5A and 5B, the solid state drive apparatus 1 may include the top package substrate module 200T and the bottom package substrate module 200B fixed by the top cover 100T and the bottom cover 100B.

In the top cover 100T and the bottom cover 100B that are coupled to each other, the top package substrate module 200T may be fixed by the plurality of protruding bar seating portions 170B and the plurality of protruding round pressing portions 180T. For example, on the bottom surface of the top package base substrate 210T of the top package substrate module 200T, the plurality of top protrusions 270T may be in contact with the plurality of protruding bar seating portions 170B of the bottom cover 100B, respectively, and on the top surface of the top package base substrate 210T, the plurality of top notches 280T may be in contact with the plurality of protruding round pressing portions 180T, respectively. For example, the first protruding bar seating portion 172B, the second protruding bar seating portion 174B, the third protruding bar seating portion 176B, and the fourth protruding bar seating portion 178B may be in contact with the first top protrusion 272T, the second top protrusion 274T, the third top protrusion 276T, and the fourth top protrusion 278T, respectively. For example, the first protruding round pressing portion 182T, the second protruding round pressing portion 184T, the third protruding round pressing portion 186T, and the fourth protruding round pressing portion 188T may be in contact with the top package base substrate 210T at the first top notch 282T, the second top notch 284T, the third top notch 286T, and the fourth top notch 288T, respectively. In a plan view, the plurality of top notches 280T may have a recessed shape to correspond to the plurality of protruding round pressing portions 180T, respectively.

The plurality of protruding bar seating portions 170B and the plurality of protruding round pressing portions 180T may fix the top package base substrate 210T in the vertical direction (the Z direction) to limit and/or prevent the top package substrate module 200T from moving in the vertical direction (the Z direction). The plurality of protruding round pressing portions 180T may fix the top package base substrate 210T in horizontal directions (the X direction, the Y direction, and a diagonal direction of the X direction and the Y direction) to limit and/or prevent the top package substrate module 200T from horizontally rotating.

In the top cover 100T and the bottom cover 100B that are coupled to each other, the bottom package substrate module 200B may be fixed by the plurality of protruding bar pressing portions 170T and the plurality of protruding round seating portions 180B. For example, on the top surface of the bottom package base substrate 210B of the bottom package substrate module 200B, the plurality of bottom protrusions 270B may be in contact with the plurality of protruding bar pressing portions 170T of the top cover 100T, respectively, and on the bottom surface of the bottom package base substrate 210B, the plurality of bottom notches 280B may be in contact with the plurality of protruding round seating portions 180B, respectively. For example, the first protruding bar pressing portion 172T, the second protruding bar pressing portion 174T, the third protruding bar pressing portion 176T, and the fourth protruding bar pressing portion 178T may be in contact with the first bottom protrusion 272B, the second bottom protrusion 274B, the third bottom protrusion 276B, and the fourth bottom protrusion 278B, respectively. For example, the first protruding round seating portion 182B, the second protruding round seating portion 184B, the third protruding round seating portion 186B, and the fourth protruding round seating portion 188B may be in contact with the bottom package substrate 210B at the first bottom notch 282B, the second bottom notch 284B, the third bottom notch 286B, and the fourth bottom notch 288B, respectively. In a plan view, the plurality of bottom notches 280B may have a recessed shape to correspond to the plurality of protruding round seating portions 180B, respectively.

The plurality of protruding bar pressing portions 170T and the plurality of protruding round seating portions 180B may fix the bottom package base substrate 210B in the vertical direction (the Z direction) to limit and/or prevent the bottom package substrate module 200B from moving in the vertical direction (the Z direction). The plurality of protruding round seating portions 180B may fix the bottom package base substrate 210B in horizontal directions (the X direction, the Y direction, and a diagonal direction of the X direction and the Y direction) to limit and/or prevent the bottom package substrate module 200B from horizontally rotating.

Figure 6A:
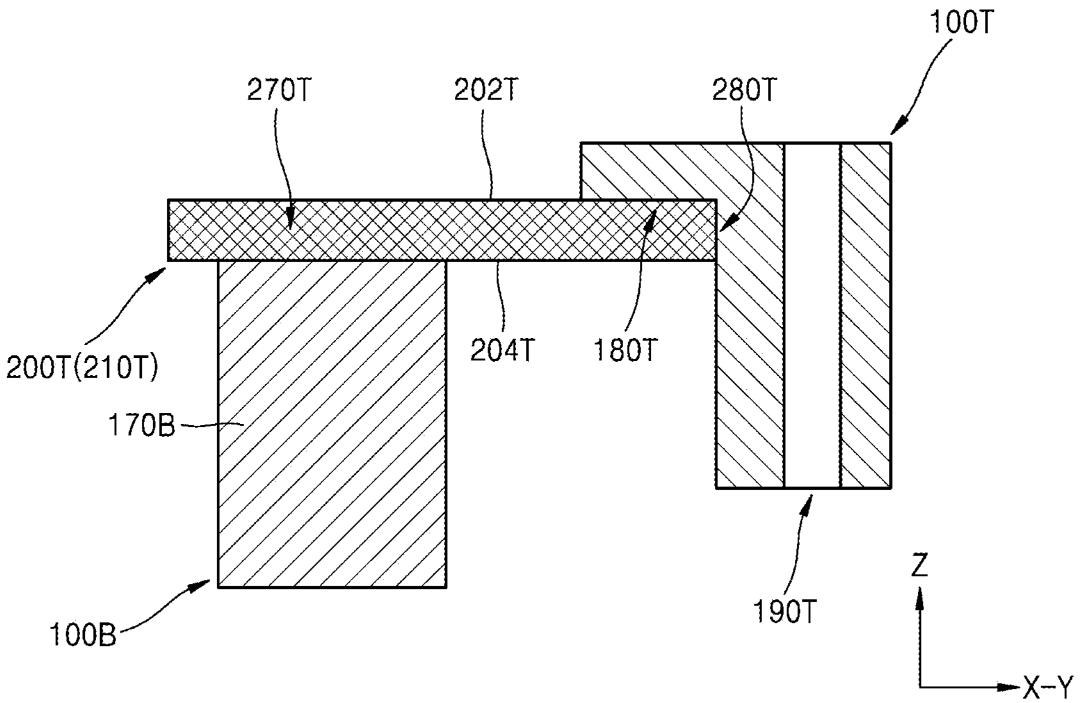
FIGS. 6A and 6B are cross-sectional views for describing a method of mounting, in a housing, package substrate modules included in a solid state drive apparatus, according to some example embodiments of the inventive concepts.
Figure 6B:
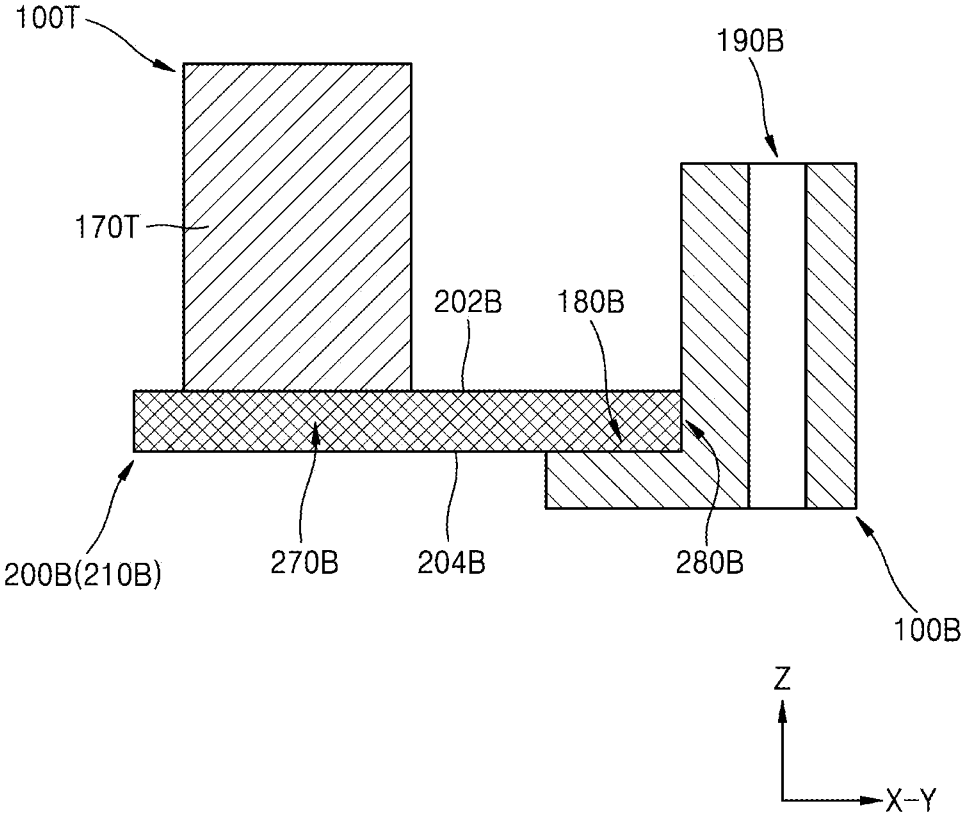

FIGS. 6A and 6B are cross-sectional views for describing a method of mounting, in a housing, package substrate modules included in a solid state drive apparatus, according to some example embodiments. Particularly, FIG. 6A is a cross-sectional view for describing a method of mounting the top package substrate module 200T between the top cover 100T and the bottom cover 100B, and FIG. 6B is a cross-sectional view for describing a method of mounting the bottom package substrate module 200B between the top cover 100T and the bottom cover 100B.

Referring to FIGS. 6A and 6B, the top cover 100T may include the plurality of protruding bar pressing portions 170T, and the plurality of protruding round pressing portions 180T respectively protruding from portions where the plurality of top screw holes 190T are located, and the bottom cover 100B may include the plurality of protruding bar seating portions 170B, and the plurality of protruding round seating portions 180B respectively protruding from portions where the plurality of bottom screw holes 190B are located.

In the top cover 100T and the bottom cover 100B that are coupled to each other, the top package substrate module 200T may be fixed by the plurality of protruding bar seating portions 170B and the plurality of protruding round pressing portions 180T. For example, on a bottom surface 204T of the top package base substrate 210T of the top package substrate module 200T, the plurality of top protrusions 270T may be in contact with the plurality of protruding bar seating portions 170B of the bottom cover 100B, respectively, and on a top surface 202T of the top package base substrate 210T, the plurality of top notches 280T may be in contact with the plurality of protruding round pressing portions 180T, respectively.

In the top cover 100T and the bottom cover 100B that are coupled to each other, the bottom package substrate module 200B may be fixed by the plurality of protruding bar pressing portions 170T and the plurality of protruding round seating portions 180B. For example, on a top surface 202B of the bottom package base substrate 210B of the bottom package substrate module 200B, the plurality of bottom protrusions 270B may be in contact with the plurality of protruding bar pressing portions 170T of the top cover 100T, respectively, and on a bottom surface 204B of the bottom package base substrate 210B, the plurality of bottom notches 280B may be in contact with the plurality of protruding round seating portions 180B, respectively.

Figure 7A:
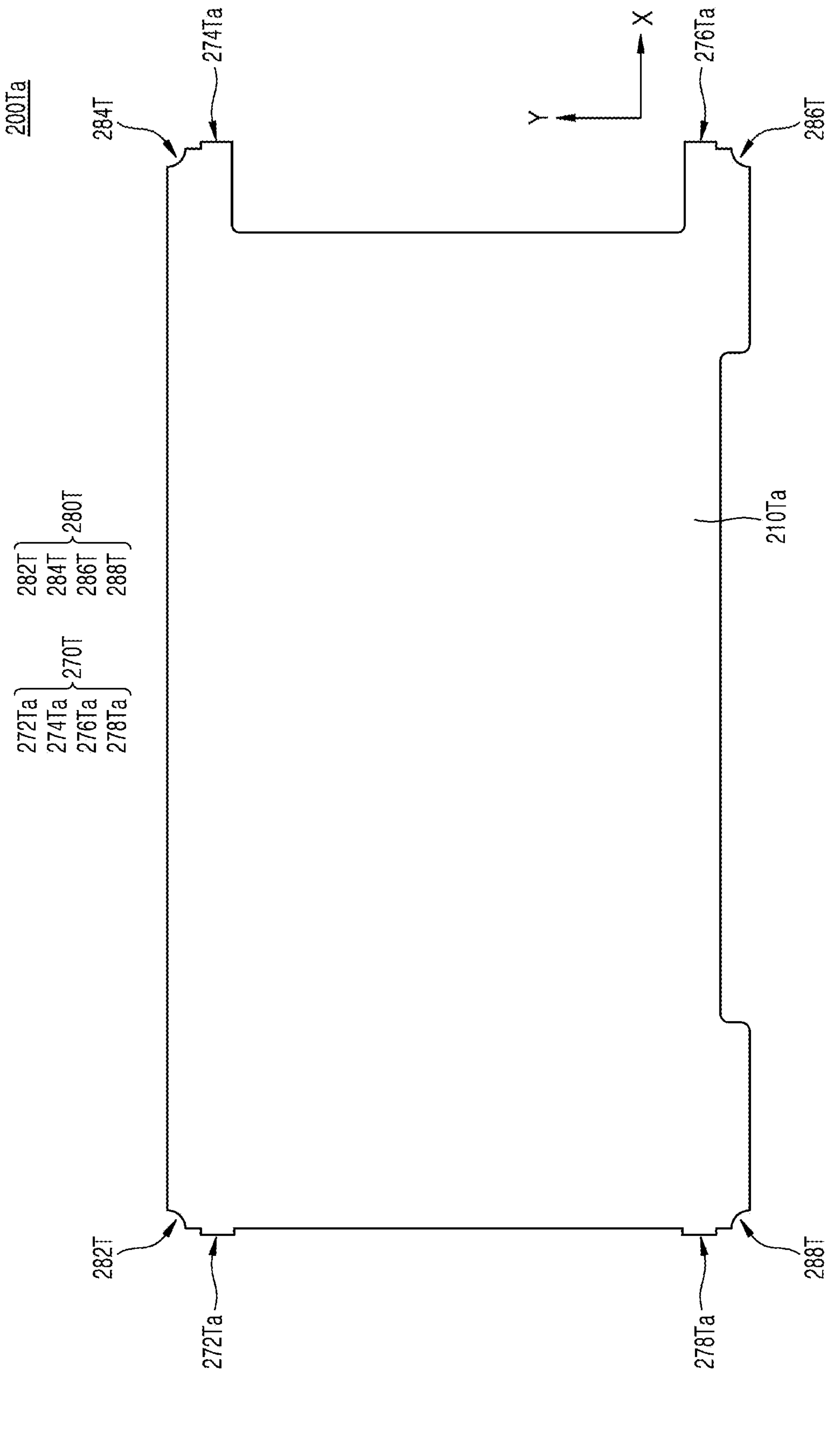
FIGS. 7A and 7B are plan views illustrating a top package substrate module and a bottom cover included in a solid state drive apparatus according to some example embodiments of the inventive concepts.
Figure 7B:
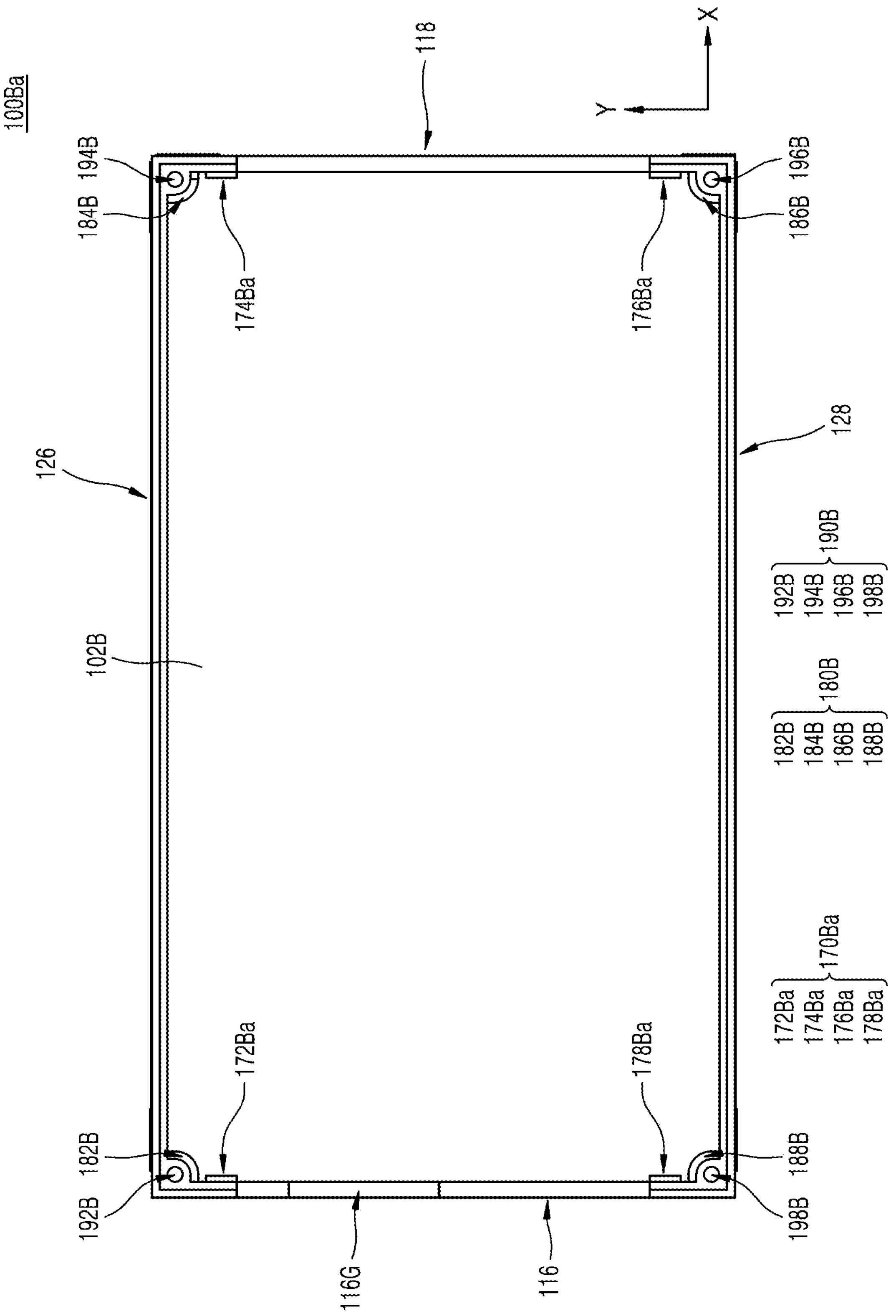

FIGS. 7A and 7B are plan views illustrating a top package substrate module 200Ta and a bottom cover 100Ba included in a solid state drive apparatus according to some example embodiments.

Referring to FIGS. 7A and 7B, the solid state drive apparatus 1 shown in FIGS. 1A and 1B may include the top package substrate module 200Ta and the bottom cover 100Ba instead of the top package substrate module 200T and the bottom cover 100B.

The top package substrate module 200Ta may include a top package base substrate 210Ta. The top package base substrate 210Ta may include a plurality of top protrusions 270Ta and the plurality of top notches 280T. The plurality of top protrusions 270Ta may include a first top protrusion 272Ta, a second top protrusion 274Ta, a third top protrusion 276Ta, and a fourth top protrusion 278Ta. The first top protrusion 272Ta and the fourth top protrusion 278Ta may be at the fourth edge EG4 of the top package base substrate 210Ta to be separated from each other, and the second top protrusion 274Ta and the third top protrusion 276Ta may be at the second edge EG2 of the top package base substrate 210Ta to be separated from each other.

The bottom cover 100Ba may include a plurality of protruding bar seating portions 170Ba and the plurality of protruding round seating portions 180B. The plurality of protruding bar seating portions 170Ba may include a first protruding bar seating portion 172Ba, a second protruding bar seating portion 174Ba, a third protruding bar seating portion 176Ba, and a fourth protruding bar seating portion 178Ba. The first protruding bar seating portion 172Ba, the second protruding bar seating portion 174Ba, the third protruding bar seating portion 176Ba, and the fourth protruding bar seating portion 178Ba may be at portions adjacent to the first corner CN1, the second corner CN2, the third corner CN3, and the fourth corner CN4 of the bottom cover 100Ba, respectively. For example, the first protruding bar seating portion 172Ba may be on the first bottom lower sidewall 116 adjacent to the first corner CN1 of the bottom cover 100Ba, the second protruding bar seating portion 174Ba may be on the second bottom lower sidewall 118 adjacent to the second corner CN2 of the bottom cover 100Ba, the third protruding bar seating portion 176Ba may be on the second bottom lower sidewall 118 adjacent to the third corner CN3 of the bottom cover 100Ba, and the fourth protruding bar seating portion 178Ba may be on the first bottom lower sidewall 116 adjacent to the fourth corner CN4 of the bottom cover 100Ba.

For example, on the bottom surface of the top package base substrate 210Ta of the top package substrate module 200Ta, the plurality of top protrusions 270Ta may be in contact with the plurality of protruding bar seating portions 170Ba of the bottom cover 100Ba, respectively. For example, the first protruding bar seating portion 172Ba, the second protruding bar seating portion 174Ba, the third protruding bar seating portion 176Ba, and the fourth protruding bar seating portion 178Ba may be in contact with the first top protrusion 272Ta, the second top protrusion 274Ta, the third top protrusion 276Ta, and the fourth top protrusion 278Ta, respectively.

Figure 8A:
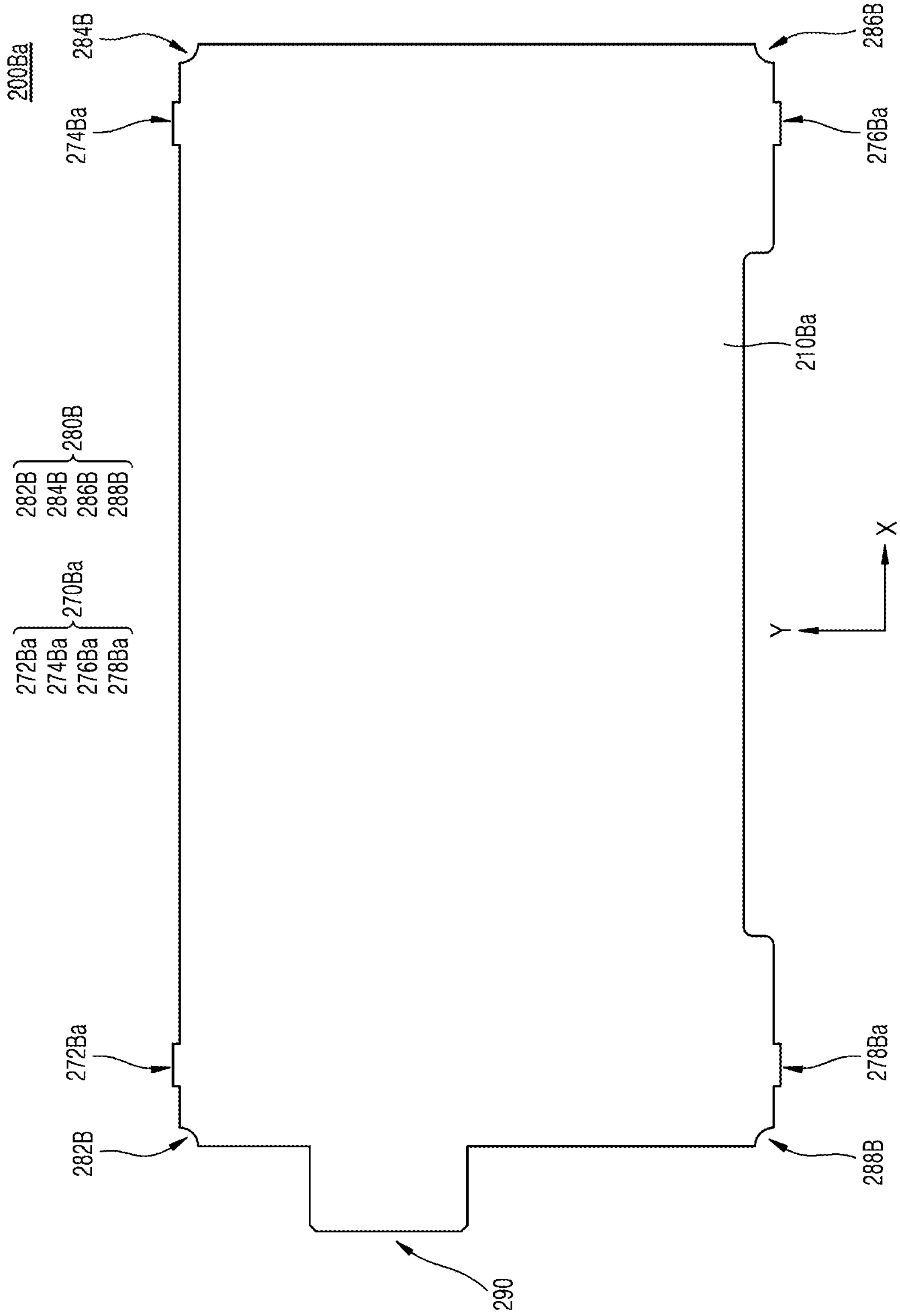
FIGS. 8A and 8B are plan views illustrating a bottom package substrate module and a top cover included in a solid state drive apparatus according to some example embodiments of the inventive concepts.
Figure 8B:
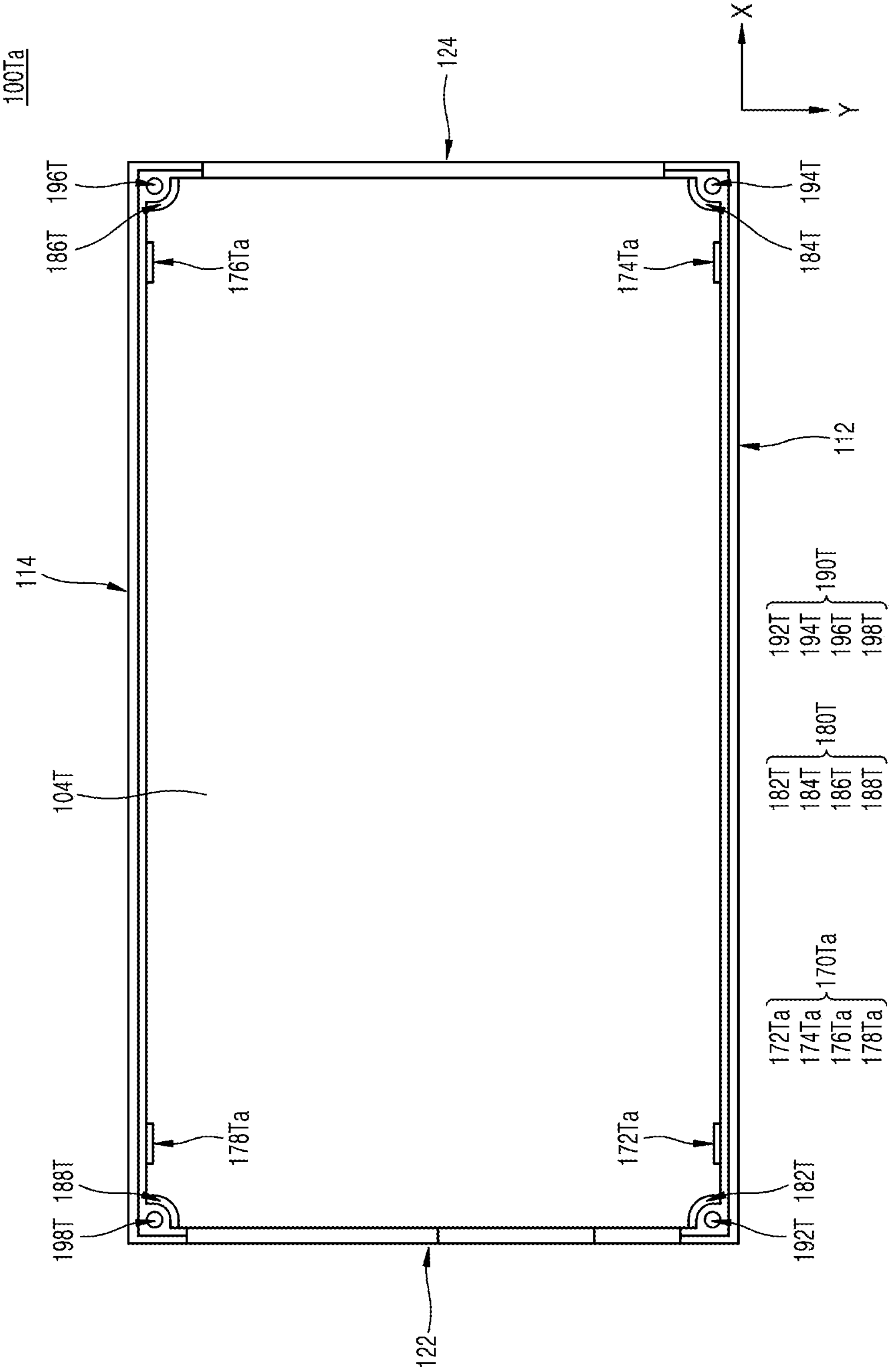

FIGS. 8A and 8B are plan views illustrating a bottom package substrate module 200Ba and a top cover 100Ta included in a solid state drive apparatus according to some example embodiments.

Referring to FIGS. 8A and 8B, the solid state drive apparatus 1 shown in FIGS. 1A and 1B may include the bottom package substrate module 200Ba and the top cover 100Ta instead of the bottom package substrate module 200B and the top cover 100T.

The bottom package substrate module 200Ba may include a bottom package base substrate 210Ba. The bottom package base substrate 210Ba may include a plurality of bottom protrusions 270Ba and the plurality of bottom notches 280B. The plurality of bottom protrusions 270Ba may include a first bottom protrusion 272Ba, a second bottom protrusion 274Ba, a third bottom protrusion 276Ba, and a fourth bottom protrusion 278Ba. The first bottom protrusion 272Ba and the second bottom protrusion 274Ba may be at the first edge EG1 of the bottom package base substrate 210Ba to be separated from each other, and the third bottom protrusion 276Ba and the fourth bottom protrusion 278Ba may be at the third edge EG3 of the bottom package base substrate 210Ba to be separated from each other. The first bottom protrusion 272Ba, the second bottom protrusion 274Ba, the third bottom protrusion 276Ba, and the fourth bottom protrusion 278Ba may be adjacent to the first corner CN1, the second corner CN2, the third corner CN3, and the fourth corner CN4 of the bottom package base substrate 210Ba, respectively.

The top cover 100Ta may include a plurality of protruding bar pressing portions 170Ta and the plurality of protruding round pressing portions 180T. The plurality of protruding bar pressing portions 170Ta may include a first protruding bar pressing portion 172Ta, a second protruding bar pressing portion 174Ta, a third protruding bar pressing portion 176Ta, and a fourth protruding bar pressing portion 178Ta. The first protruding bar pressing portion 172Ta, the second protruding bar pressing portion 174Ta, the third protruding bar pressing portion 176Ta, and the fourth protruding bar pressing portion 178Ta may be at portions adjacent to the first corner CN1, the second corner CN2, the third corner CN3, and the fourth corner CN4 of the top cover 100Ta, respectively. For example, the first protruding bar pressing portion 172Ta may be on the first top lower sidewall 112 adjacent to the first corner CN1 of the top cover 100Ta, the second protruding bar pressing portion 174Ta may be on the first top lower sidewall 112 adjacent to the second corner CN2 of the top cover 100Ta, the third protruding bar pressing portion 176Ta may be on the second top lower sidewall 114 adjacent to the third corner CN3 of the top cover 100Ta, and the fourth protruding bar pressing portion 178Ta may be on the second top lower sidewall 114 adjacent to the fourth corner CN4 of the top cover 100Ta.

For example, on the top surface of the bottom package base substrate 210Ba of the bottom package substrate module 200Ba, the plurality of bottom protrusions 270Ba may be in contact with the plurality of protruding bar pressing portions 170Ta of the top cover 100Ta, respectively. For example, the first protruding bar pressing portion 172Ta, the second protruding bar pressing portion 174Ta, the third protruding bar pressing portion 176Ta, and the fourth protruding bar pressing portion 178Ta may be in contact with the first bottom protrusion 272Ba, the second bottom protrusion 274Ba, the third bottom protrusion 276Ba, and the fourth bottom protrusion 278Ba, respectively.

Figure 9A:
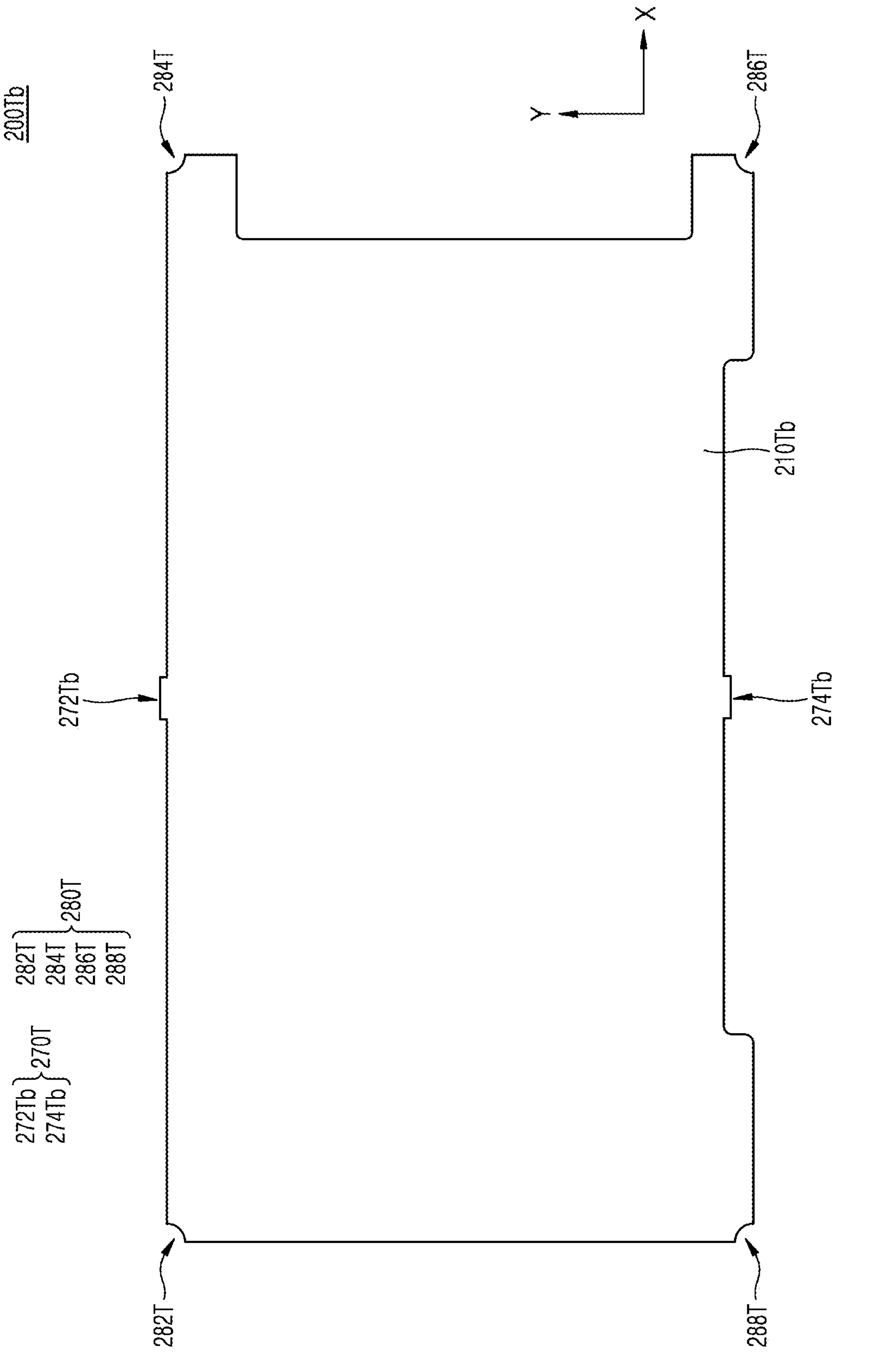
FIGS. 9A and 9B are plan views illustrating a top package substrate module and a bottom cover included in a solid state drive apparatus according to some example embodiments of the inventive concepts.
Figure 9B:
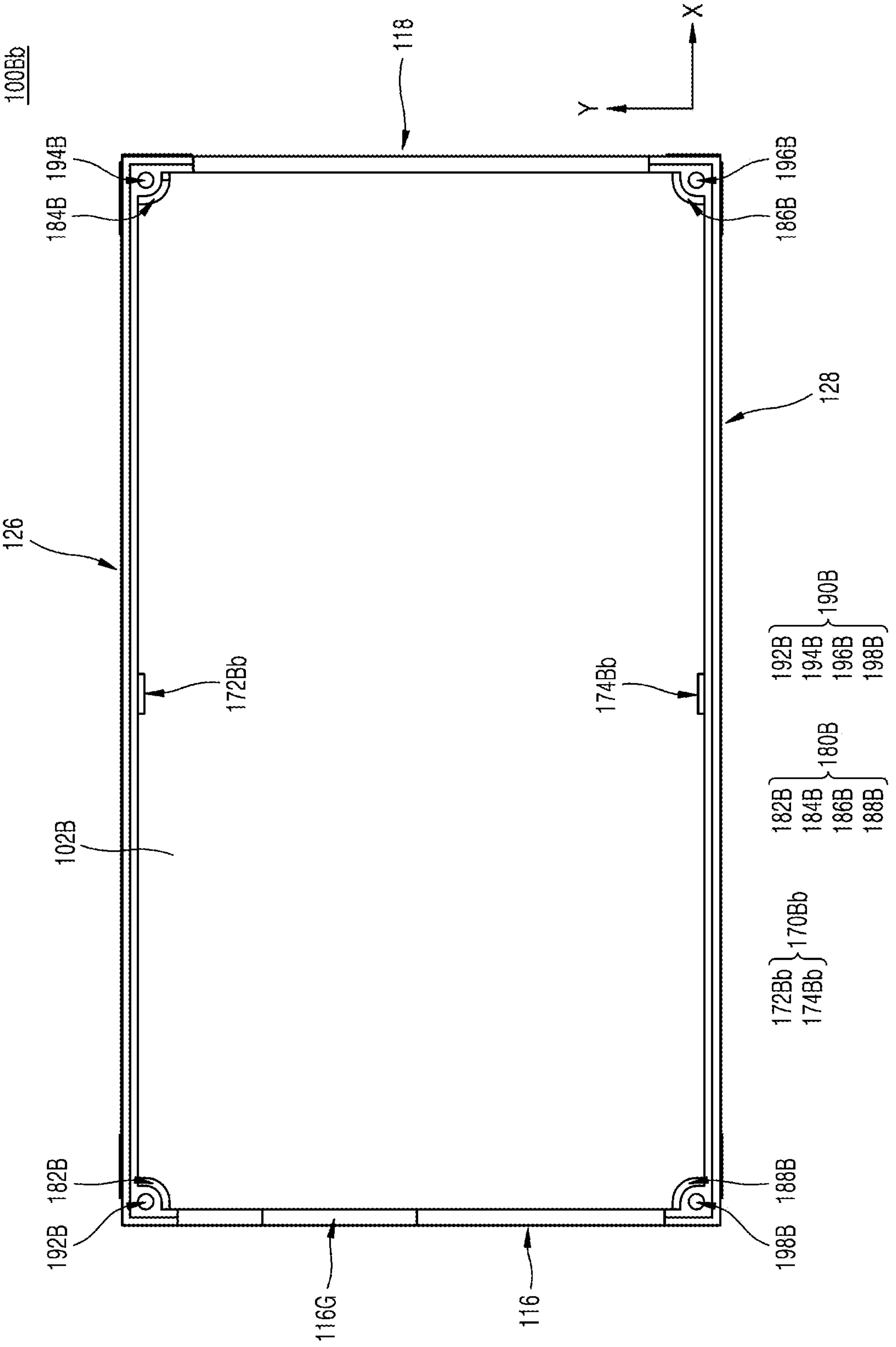

FIGS. 9A and 9B are plan views illustrating a top package substrate module 200Tb and a bottom cover 100Bb included in a solid state drive apparatus according to some example embodiments.

Referring to FIGS. 9A and 9B, the solid state drive apparatus 1 shown in FIGS. 1A and 1B may include the top package substrate module 200Tb and the bottom cover 100Bb instead of the top package substrate module 200T and the bottom cover 100B.

The top package substrate module 200Tb may include a top package base substrate 210Tb. The top package base substrate 210Tb may include a plurality of top protrusions 270Tb and the plurality of top notches 280T. The plurality of top protrusions 270Tb may include a first top protrusion 272Tb and a second top protrusion 274Tb. The first top protrusion 272Tb may be at the first edge EG1 of the top package base substrate 210Tb, and the second top protrusion 274Tb may be at the third edge EG3 of the top package base substrate 210Tb. In some example embodiments, in a plan view, the first top protrusion 272Tb may be at an approximately intermediate portion of the first edge EG1 between the first corner CN1 and the second corner CN2 of the top package base substrate 210Tb, and the second top protrusion 274Tb may be at an approximately intermediate portion of the third edge EG3 between the third corner CN3 and the fourth corner CN4 of the top package base substrate 210Tb.

The bottom cover 100Bb may include a plurality of protruding bar seating portions 170Bb and the plurality of protruding round seating portions 180B. The plurality of protruding bar seating portions 170Bb may include a first protruding bar seating portion 172Bb and a second protruding bar seating portion 174Bb. The first protruding bar seating portion 172Bb may be at the first edge EG1, and the second protruding bar seating portion 174Bb may be at the third edge EG3. In some example embodiments, in a plan view, the first protruding bar seating portion 172Bb may be on the first bottom higher sidewall 126 at an approximately intermediate portion of the first edge EG1 between the first corner CN1 and the second corner CN2, and the second protruding bar seating portion 174Bb may be on the second bottom higher sidewall 128 at an approximately intermediate portion of the third edge EG3 between the third corner CN3 and the fourth corner CN4.

For example, on the bottom surface of the top package base substrate 210Tb of the top package substrate module 200Tb, the plurality of top protrusions 270Tb may be in contact with the plurality of protruding bar seating portions 170Bb of the bottom cover 100Bb, respectively. For example, the first protruding bar seating portion 172Bb and the second protruding bar seating portion 174Bb may be in contact with the first top protrusion 272Tb and the second top protrusion 274Tb, respectively.

Figure 10A:
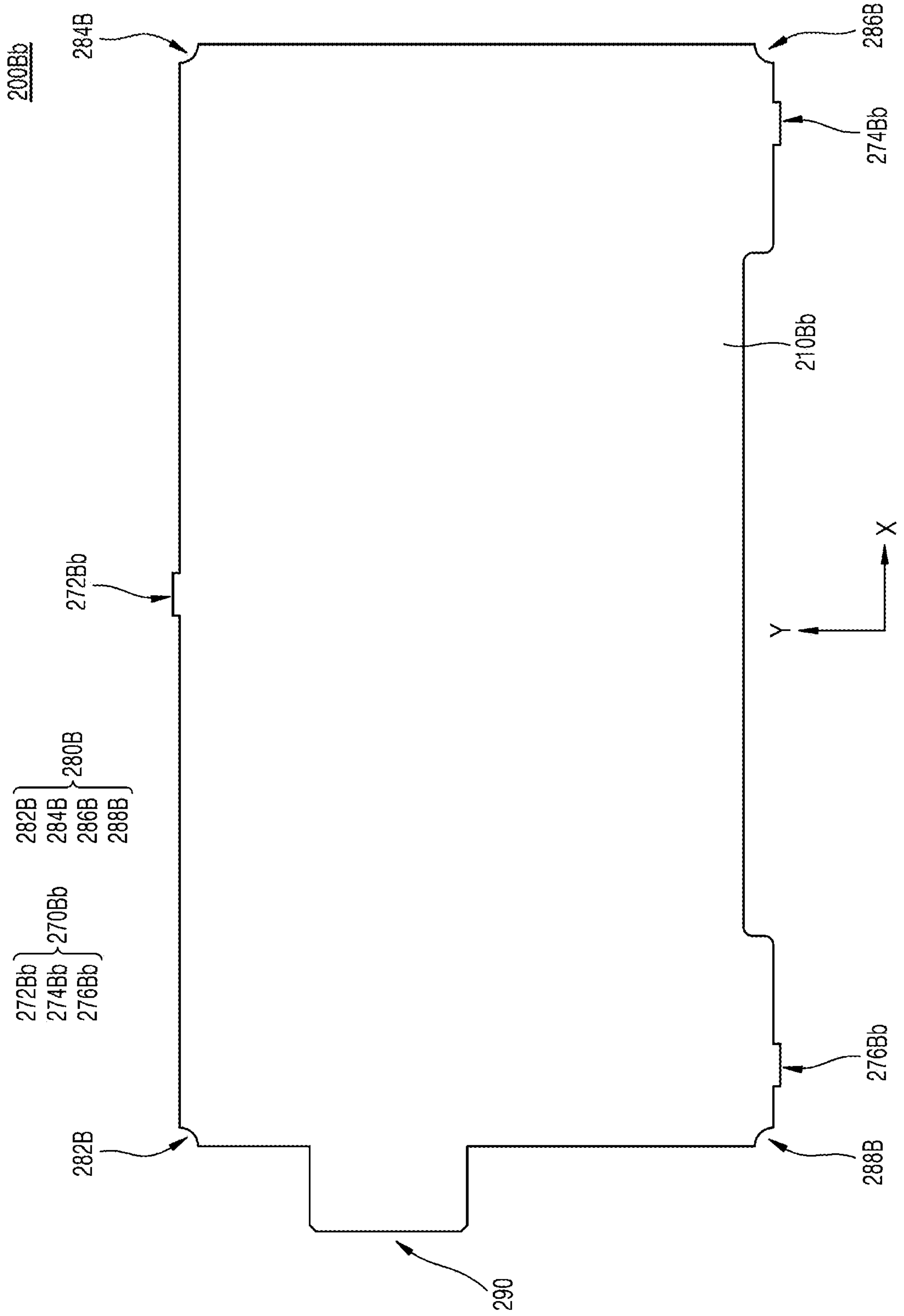
FIGS. 10A and 10B are plan views illustrating a bottom package substrate module and a top cover included in a solid state drive apparatus according to some example embodiments of the inventive concepts.
Figure 10B:
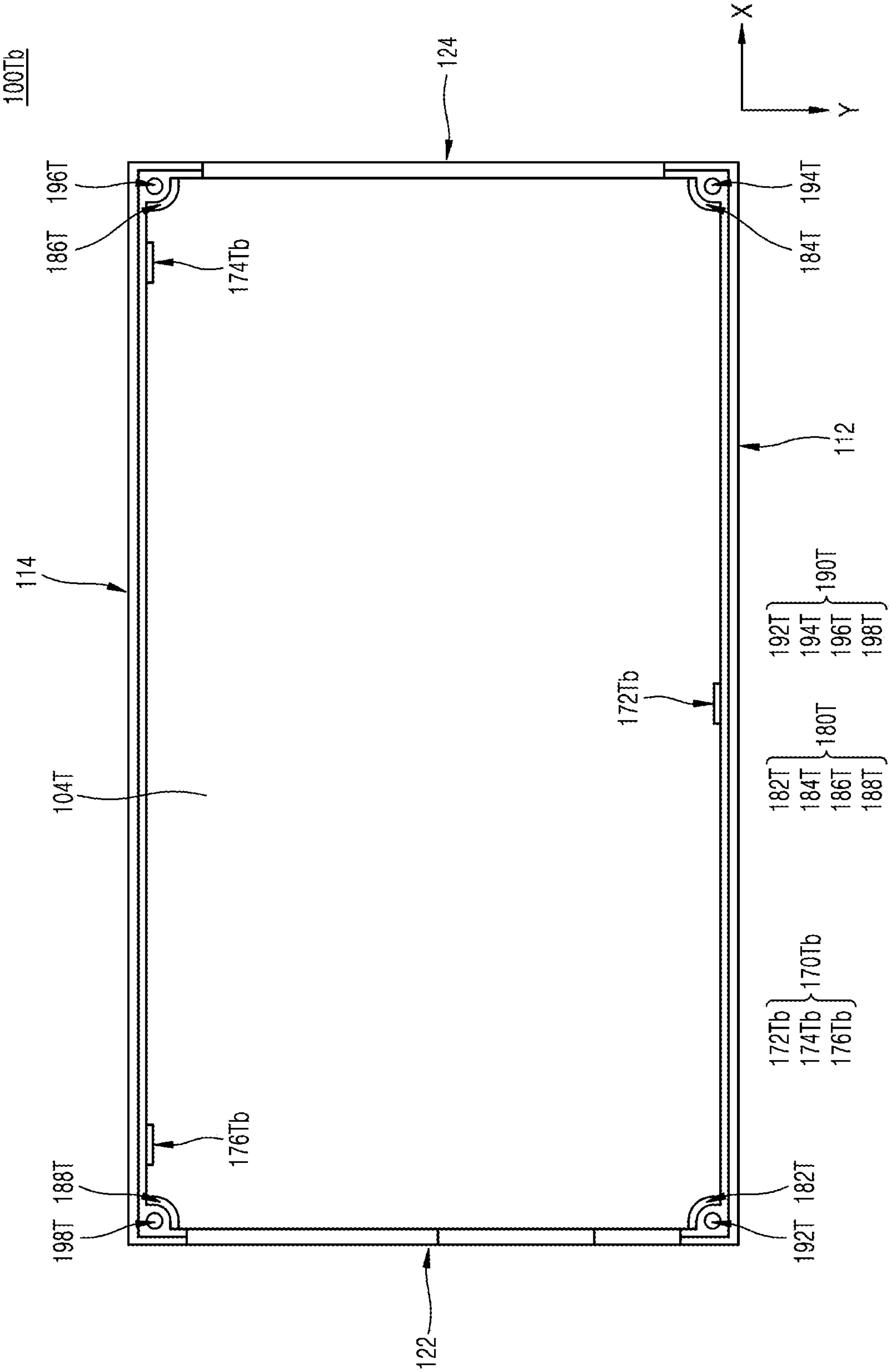

FIGS. 10A and 10B are plan views illustrating a bottom package substrate module 200Bb and a top cover 100Tb included in a solid state drive apparatus according to some example embodiments.

Referring to FIGS. 10A and 10B, the solid state drive apparatus 1 shown in FIGS. 1A and 1B may include the bottom package substrate module 200Bb and the top cover 100Tb instead of the bottom package substrate module 200B and the top cover 100T.

The bottom package substrate module 200Bb may include a bottom package base substrate 210Bb. The bottom package base substrate 210Bb may include a plurality of bottom protrusions 270Bb and the plurality of bottom notches 280B.

The plurality of bottom protrusions 270Bb may include a first bottom protrusion 272Bb, a second bottom protrusion 274Bb, and a third bottom protrusion 276Bb. The first bottom protrusion 272Bb may be at the first edge EG1 of the bottom package base substrate 210Bb, and the second bottom protrusion 274Bb and the third bottom protrusion 276Bb may be at the third edge EG3 of the bottom package base substrate 210Bb to be separated from each other. In some example embodiments, in a plan view, the first bottom protrusion 272Bb may be at an approximately intermediate portion of the first edge EG1 between the first corner 1 and the second corner CN2 of the bottom package base substrate 210Bb, and the second bottom protrusion 274Bb and the third bottom protrusion 276Bb may be adjacent to the third corner CN3 and the fourth corner CN4 of the bottom package base substrate 210Bb, respectively.

The top cover 100Tb may include a plurality of protruding bar pressing portions 170Tb and the plurality of protruding round pressing portions 180T. The plurality of protruding bar pressing portions 170Tb may include a first protruding bar pressing portion 172Tb, a second protruding bar pressing portion 174Tb, and a third protruding bar pressing portion 176Tb. The first protruding bar pressing portion 172Tb may be at the first edge EG1 of the top cover 100Tb, and the second protruding bar pressing portion 174Tb and the third protruding bar pressing portion 176Tb may be at the third edge EG3 of the top cover 100Tb to be separated from each other. In some example embodiments, the first protruding bar pressing portion 172Tb may be on the first top lower sidewall 112 at an approximately intermediate portion of the first edge EG1 between the first corner CN1 and the second corner CN2 of the top cover 100Tb, and the second protruding bar pressing portion 174Tb and the third protruding bar pressing portion 176Tb may be on the second top lower sidewall 114 adjacent to the third corner CN3 and the fourth corner CN4 of the top cover 100Tb, respectively.

For example, on the top surface of the bottom package base substrate 210Bb of the bottom package substrate module 200Bb, the plurality of bottom protrusions 270Bb may be in contact with the plurality of protruding bar pressing portions 170Tb of the top cover 100Tb, respectively. For example, the first protruding bar pressing portion 172Tb, the second protruding bar pressing portion 174Tb, and the third protruding bar pressing portion 176Tb may be in contact with the first bottom protrusion 272Bb, the second bottom protrusion 274Bb, and the third bottom protrusion 276Bb, respectively.

Figure 11:
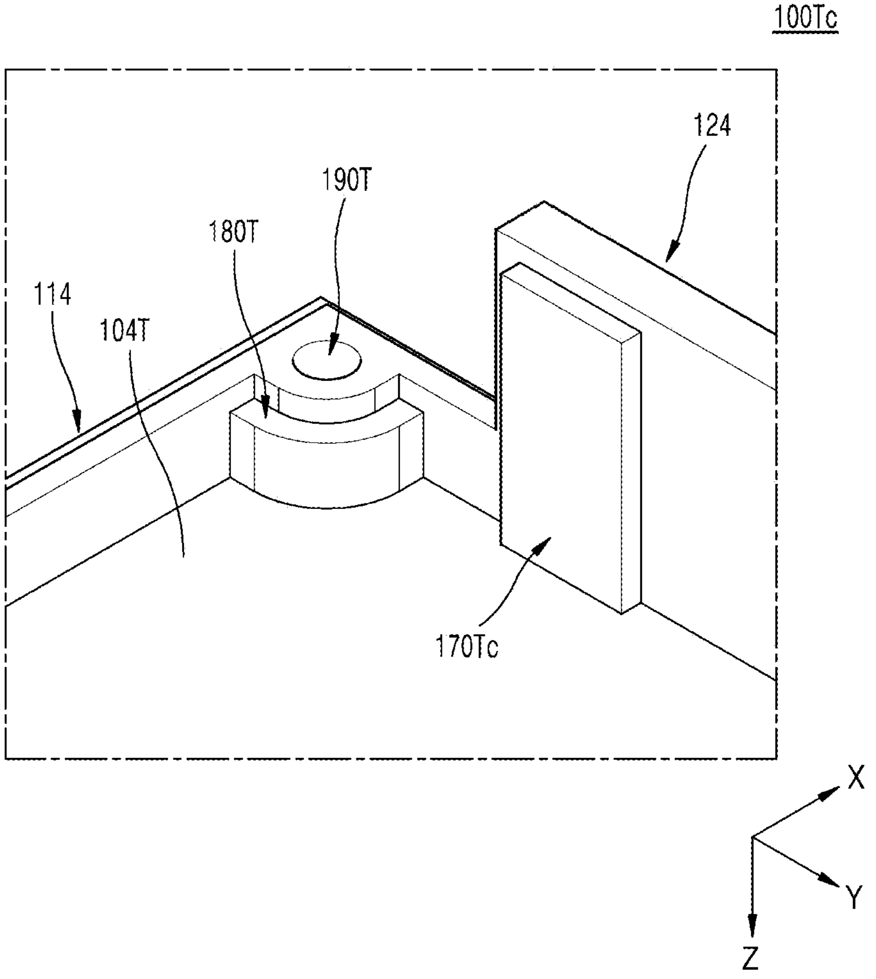
FIG. 11 is a magnified perspective view illustrating a top cover of a housing of a solid state drive apparatus according to some example embodiments of the inventive concepts.

FIG. 11 is a magnified perspective view of a top cover 100Tc of a housing of a solid state drive apparatus according to some example embodiments.

Referring to FIG. 11, the solid state drive apparatus 1 shown in FIGS. 1A and 1B may include the top cover 100Tc instead of the top cover 100T. The top cover 100Tc may include a plurality of protruding bar pressing portions 170Tc and the plurality of protruding round pressing portions 180T. In a plan view, the plurality of protruding bar pressing portions 170Tc may be approximately at the same locations as the plurality of protruding bar pressing portions 170T shown in FIGS. 3A to 3D, respectively. The heights of the plurality of protruding bar pressing portions 170Tc may be the same as each other. In some example embodiments, from the bottom surface 104T of the top cover 100Tc in the reverse direction of the vertical direction (the Z direction), the height of each of the plurality of protruding bar pressing portions 170Tc may be less than the height of the second top higher sidewall 124.

Figure 12:
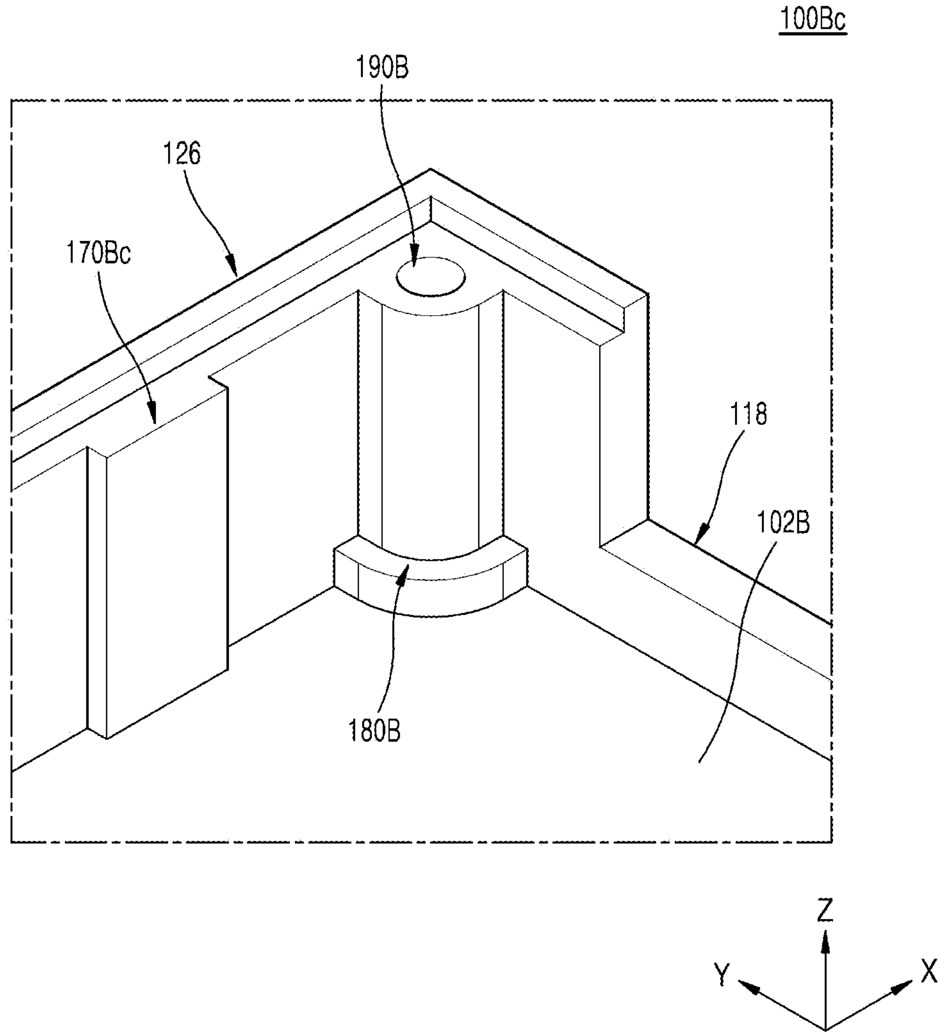
FIG. 12 is a magnified perspective view illustrating a bottom cover of a housing of a solid state drive apparatus according to some example embodiments of the inventive concepts.

FIG. 12 is a magnified perspective view of a bottom cover 100Bc of a housing of a solid state drive apparatus according to some example embodiments.

Referring to FIG. 12, the solid state drive apparatus 1 shown in FIGS. 1A and 1B may include the bottom cover 100Bc instead of the bottom cover 100B. The bottom cover 100Bc may include a plurality of protruding bar seating portions 170Bc and the plurality of protruding round seating portions 180B. In a plan view, the plurality of protruding bar seating portions 170Bc may be approximately at the same locations as the plurality of protruding bar seating portions 170B shown in FIGS. 4A to 4D, respectively. The heights of the plurality of protruding bar seating portions 170Bc may be the same as each other. In some example embodiments, from the top surface 102B of the bottom cover 100Bc in the vertical direction (the Z direction), the height of each of the plurality of protruding bar seating portions 170Bc may be greater than the height of the second bottom lower sidewall 118 and the same as the height of at least a portion of the first bottom higher sidewall 126.

Figure 13A:
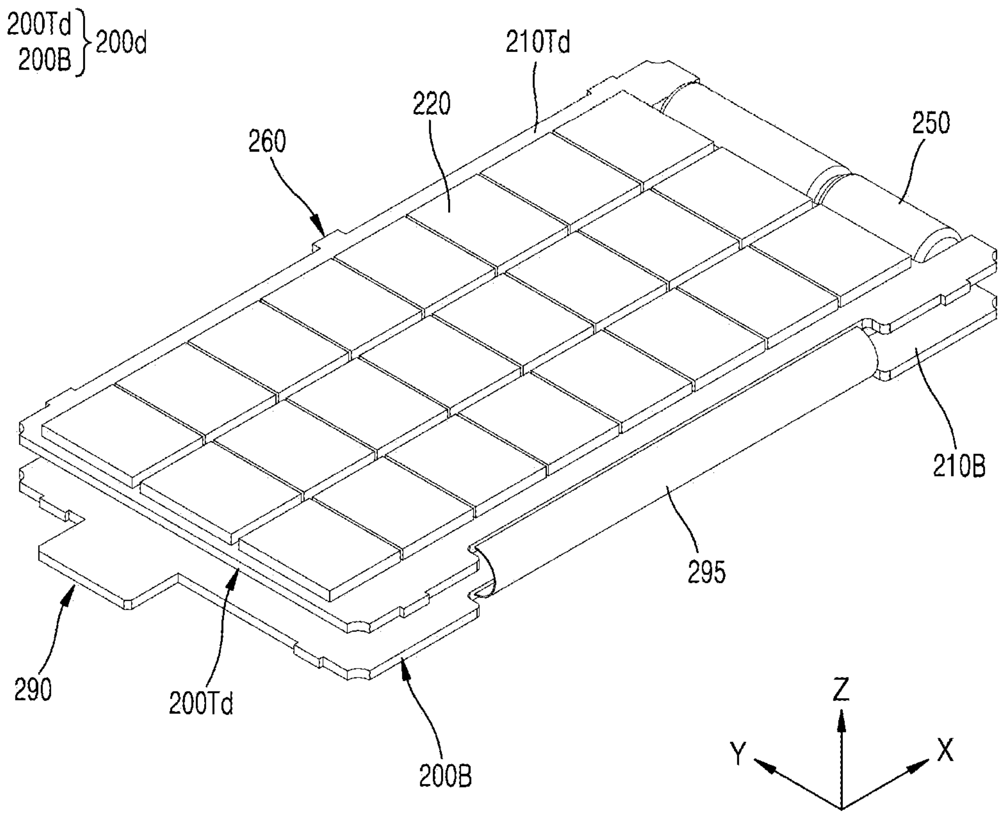
FIGS. 13A, 13B and to 13C are perspective views illustrating package substrate modules and a bottom cover of a solid state drive apparatus according to some example embodiments of the inventive concepts.
Figure 13B:
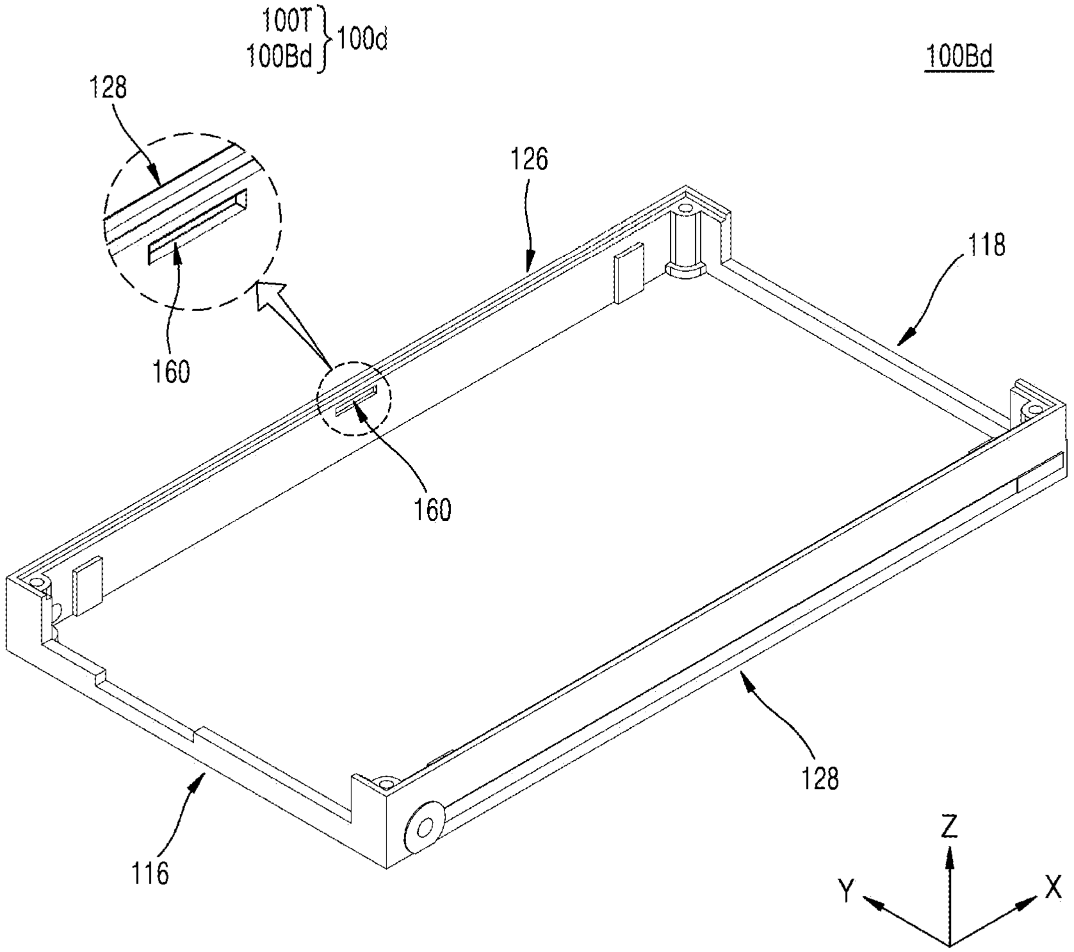
Figure 13C:
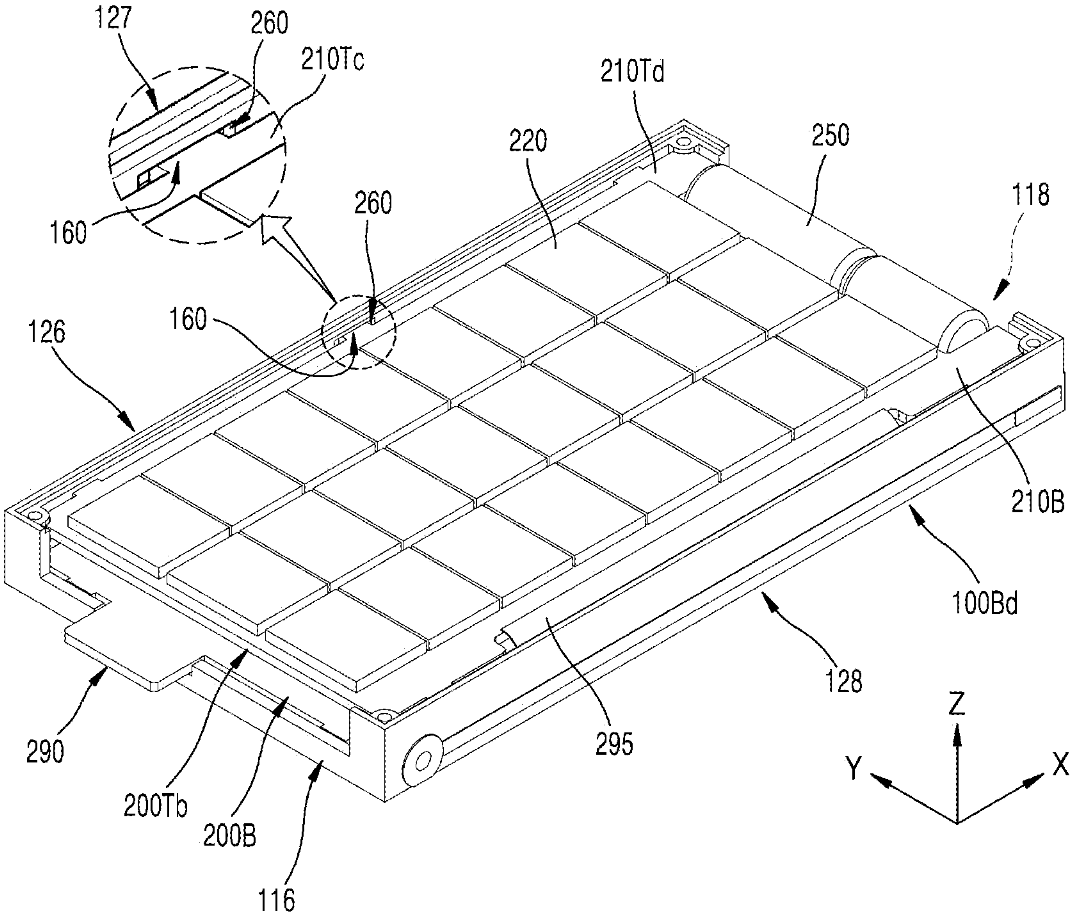

FIGS. 13A to 13C are perspective views illustrating a plurality of package substrate modules 200*d* and a bottom cover 100Bd of a solid state drive apparatus according to some example embodiments. Particularly, FIG. 13A is a perspective view illustrating the plurality of package substrate modules 200*d*, FIG. 13B is a perspective view illustrating the bottom cover 100Bd, and FIG. 13C is a perspective view illustrating the bottom cover 100Bd and the plurality of package substrate modules 200*d* mounted on the bottom cover 100Bd.

Referring to FIGS. 13A to 13C, the solid state drive apparatus 1 shown in FIGS. 1A and 1B may include the plurality of package substrate modules 200*d* and a housing 100*d* instead of the plurality of package substrate modules 200 and the housing 100. The plurality of package substrate modules 200*d* may include a top package substrate module 200Td and the bottom package substrate module 200B. The housing 100*d* may include the top cover 100T (see FIG. 1A) and the bottom cover 100Bd.

The top package substrate module 200Td may include a top package base substrate 210Td. The top package base substrate 210Td may further include a fixing protrusion 260. The fixing protrusion 260 may be at the opposite side of a side of the top package base substrate 210Td where the connection member 295 is connected. For example, when the connection member 295 is connected to the third edge EG3 of the top package base substrate 210Td, the fixing protrusion 260 may be at the first edge EG1 of the top package base substrate 210Td.

The bottom cover 100Bd may have a fixing groove 160 in any one of the first bottom higher sidewall 126 and the second bottom higher sidewall 128. For example, when the first bottom higher sidewall 126 and the second bottom higher sidewall 128 are respectively at the first edge EG1 and the third edge EG3 of the bottom cover 100Bd and the fixing protrusion 260 is at the first edge EG1 of the top package base substrate 210Td, the first bottom higher sidewall 126 may have the fixing groove 160.

When the plurality of package substrate modules 200*d* are coupled to the bottom cover 100Bd, the fixing protrusion 260 may be coupled to the fixing groove 160 of the bottom cover 100Bd. Even when the connection member 295 is a flexible connection member, the fixing protrusion 260 may be coupled to the fixing groove 160 such that the top package substrate module 200Td is fixed to the bottom cover 100Bd. Therefore, in a process of coupling the top cover 100T to the bottom cover 100Bd, movement of the top package substrate module 200Td may be limited and/or prevented to stably couple the top cover 100T to the bottom cover 100Bd.

Referring to FIGS. 1A to 13C, the solid state drive apparatus 1 according to the inventive concepts may ensure the gap between the top package substrate module 200T, 200Ta, 200Tb, or 200Td and the bottom package substrate module 200B, 200Ba, or 200Bb only with the top cover 100T, 100Ta, 100Tb, or 100Tc and the bottom cover 100B, 100Ba, 100Bb, 100Bc, or 100Bd, and may fix the top package substrate module 200T, 200Ta, 200Tb, or 200Td and the bottom package substrate module 200B, 200Ba, or 200Bb to the top cover 100T, 100Ta, 100Tb, or 100Tc and the bottom cover 100B, 100Ba, 100Bb, 100Bc, or 100Bd, without using a separate frame component for ensuring the gap between the top package substrate module 200T, 200Ta, 200Tb, or 200Td and the bottom package substrate module 200B, 200Ba, or 200Bb, and fixing the top package substrate module 200T, 200Ta, 200Tb, or 200Td and the bottom package substrate module 200B, 200Ba, or 200Bb. Therefore, the solid state drive apparatus 1 according to the inventive concepts may not include a separate frame component, thereby reducing the volume thereof.

One or more of the elements disclosed above may include or be implemented in processing circuitry such as hardware including logic circuits; a hardware/software combination such as a processor executing software; or a combination thereof. For example, the processing circuitry more specifically may include, but is not limited to, a central processing unit (CPU), an arithmetic logic unit (ALU), a digital signal processor, a microcomputer, a field programmable gate array (FPGA), a System-on-Chip (SoC), a programmable logic unit, a microprocessor, an application-specific integrated circuit (ASIC), etc.

While the inventive concepts have been particularly shown and described with reference to some example embodiments thereof, it will be understood that various changes in form and detail may be made therein without departing from the spirit and scope of the following claims.

What is claimed is:

1. A solid state drive apparatus comprising:

a housing comprising a top cover and a bottom cover, the top cover and the bottom cover defining an internal space of the housing; and a plurality of package substrate modules accommodated in the internal space, the plurality of package substrate modules comprising a top package substrate module having a top package base substrate and a bottom package substrate module having a bottom package base substrate, the top package substrate module and the bottom package substrate module being separated from each other in a vertical direction, wherein the top package base substrate comprises a plurality of top protrusions and a plurality of top notches, the bottom package base substrate comprises a plurality of bottom protrusions and a plurality of bottom notches, the top cover comprises a plurality of protruding bar pressing portions corresponding to the plurality of bottom protrusions and a plurality of protruding round pressing portions corresponding to the plurality of bottom notches, and the bottom cover comprises a plurality of protruding bar seating portions corresponding to the plurality of top protrusions and a plurality of protruding round seating portions corresponding to the plurality of top notches.

2. The solid state drive apparatus of claim 1, wherein each of numbers of the top protrusions separated from each other, the bottom protrusions separated from each other, the protruding bar pressing portions separated from each other, and the protruding bar seating portions separated from each other is 2 or greater, and each of numbers of the top notches separated from each other, the bottom notches separated from each other, the protruding round pressing portions separated from each other, and the protruding round seating portions separated from each other is 4 or greater.

3. The solid state drive apparatus of claim 1, wherein bottom surfaces of the plurality of protruding bar pressing portions of the top cover are in contact with top surfaces of the plurality of bottom protrusions of the bottom package base substrate, and the plurality of protruding round pressing portions of the top cover are in contact with the top package base substrate at the plurality of top notches.

4. The solid state drive apparatus of claim 1, wherein top surfaces of the plurality of protruding bar seating portions of the bottom cover are in contact with bottom surfaces of the plurality of top protrusions of the top package base substrate, and the plurality of protruding round seating portions of the bottom cover are in contact with the bottom package base substrate at the plurality of bottom notches.

5. The solid state drive apparatus of claim 1, wherein the top cover and the bottom cover respectively have a plurality of top screw holes and a plurality of bottom screw holes that together define a plurality of screw holes, the plurality of protruding round pressing portions protrude toward the internal space of the housing from portions of the top cover at the plurality of top screw holes, respectively, and the plurality of protruding round seating portions protrude toward the internal space of the housing from portions of the bottom cover at the plurality of bottom screw holes, respectively.

6. The solid state drive apparatus of claim 5, wherein the plurality of screw holes are at corners of the housing, respectively, and each of the plurality of protruding bar pressing portions and each of the plurality of protruding bar seating portions are adjacent to any one of the corners of the housing.

7. The solid state drive apparatus of claim 1, wherein the top cover comprises a first top lower sidewall and a second top lower sidewall facing each other, and the top cover comprises a first top higher sidewall and a second top higher sidewall facing each other, the first and second top lower sidewalls and the first and second top higher sidewalls are respectively at edges of the housing, the bottom cover comprises a first bottom lower sidewall and a second bottom lower sidewall facing each other, and the bottom cover comprises a first bottom higher sidewall and a second bottom higher sidewall facing each other, the first and second bottom lower sidewalls and the first and second bottom higher sidewalls are respectively at the edges of the housing, and the first top lower sidewall, the second top lower sidewall, the first top higher sidewall, and the second top higher sidewall of the top cover are in contact with the first bottom higher sidewall, the second bottom higher sidewall, the first bottom lower sidewall, and the second bottom lower sidewall of the bottom cover, respectively.

8. The solid state drive apparatus of claim 7, wherein at least one of the plurality of protruding bar pressing portions is on each of the first top higher sidewall and the second top higher sidewall, and at least one of the plurality of protruding bar seating portions is on each of the first bottom higher sidewall and the second bottom higher sidewall.

9. The solid state drive apparatus of claim 1, wherein the plurality of package substrate modules comprise a rigid-flexible printed circuit board (RF-PCB), and the plurality of package substrate modules further comprise a connection member having one end and the other end respectively connected to the top package base substrate and the bottom package base substrate.

10. The solid state drive apparatus of claim 9, wherein the top package base substrate further comprises a fixing protrusion at a side of the top package base substrate opposite to a side where the connection member is connected, and the bottom cover has a fixing groove corresponding to the fixing protrusion.

11. A solid state drive apparatus comprising:

a housing comprising a top cover and a bottom cover, the top cover and the bottom cover defining an internal space of the housing;

a top package substrate module accommodated in the internal space of the housing, and the top package substrate module comprising a top package base substrate;

a bottom package substrate module separated from the top package substrate module in a vertical direction, the bottom package substrate module accommodated in the internal space of the housing, and the bottom package substrate module comprising a bottom package base substrate; and a connection member electrically connecting the top package substrate module to the bottom package substrate module, wherein the housing has a plurality of screw holes at corners of the housing, the plurality of screw holes including a plurality of top screw holes in the top cover and a plurality of bottom screw holes in the bottom cover, the top cover comprises a plurality of protruding bar pressing portions and a plurality of protruding round pressing portions at corners of the top cover, the bottom cover comprises a plurality of protruding bar seating portions and a plurality of protruding round seating portions at corners of the bottom cover, the top package base substrate comprises a plurality of top protrusions and a plurality of top notches, the plurality of top protrusions are in contact with the plurality of protruding bar seating portions of the bottom cover, and the plurality of protruding round pressing portions of the top cover are in contact with the top package base substrate at the plurality of top notches, and the bottom package base substrate comprises a plurality of bottom protrusions and a plurality of bottom notches, the plurality of bottom protrusions are in contact with the plurality of protruding bar pressing portions of the top cover, and the plurality of protruding round seating portions of the bottom cover are in contact with the bottom package base substrate at the plurality of bottom notches.

12. The solid state drive apparatus of claim 11, wherein the top cover comprises a first top lower sidewall and a second top lower sidewall facing each other, and the top cover comprises a first top higher sidewall and a second top higher sidewall facing each other, the first and second top lower sidewalls and the first and second top higher sidewalls are respectively at edges of the housing, the bottom cover comprises a first bottom lower sidewall and a second bottom lower sidewall facing each other, and the bottom cover comprises a first bottom higher sidewall and a second bottom higher sidewall facing each other, the first and second bottom lower sidewalls and the first and second bottom higher sidewalls are respectively at the edges of the housing, some of the plurality of protruding bar pressing portions are on the first top higher sidewall, and some other of the plurality of protruding bar pressing portions are on the second top higher sidewall, and some of the plurality of protruding bar seating portions are on the first bottom higher sidewall, and some other of the plurality of protruding bar seating portions are on the second bottom higher sidewall.

13. The solid state drive apparatus of claim 12, wherein a height of each of the plurality of protruding round pressing portions is less than a height of each of the first and second top lower sidewalls, and a height of each of the plurality of protruding round seating portions is less than a height of each of the first and second bottom lower sidewalls.

14. The solid state drive apparatus of claim 12, wherein a height of each of the plurality of protruding bar pressing portions is the same as a height of each of the first and second top higher sidewalls, and a height of each of the plurality of protruding bar seating portions is less than or equal to a height of each of the first and second bottom higher sidewalls.

15. The solid state drive apparatus of claim 11, wherein the plurality of protruding bar pressing portions are adjacent to the corners of the top cover, respectively, and the plurality of protruding bar seating portions are adjacent to the corners of the bottom cover, respectively.

16. The solid state drive apparatus of claim 11, wherein the plurality of top protrusions do not overlap the plurality of bottom protrusions in the vertical direction.

17. The solid state drive apparatus of claim 11, wherein the plurality of top notches overlap the plurality of bottom notches in the vertical direction.

18. The solid state drive apparatus of claim 11, wherein the connection member comprises a flexible printed circuitry (FPC) connector.

19. A solid state drive apparatus comprising:

a housing comprising a top cover and a bottom cover, the top cover and the bottom cover defining an internal space of the housing;

a top package substrate module accommodated in the internal space of the housing, and the top package substrate module comprising a top package base substrate and upper semiconductor chips mounted on the top package base substrate;

a bottom package substrate module separated from the top package substrate module in a vertical direction, the bottom package substrate module accommodated in the internal space of the housing, and the bottom package substrate module comprising a bottom package base substrate and lower semiconductor chips mounted on the bottom package base substrate; and a connection member comprising a flexible printed circuitry (FPC) connector electrically connecting the top package substrate module to the bottom package substrate module, wherein the housing has a plurality of screw holes at corners of the housing, the plurality of screw holes including a plurality of top screw holes in the top cover and a plurality of bottom screw holes in the bottom cover, the top cover comprises two top lower sidewalls facing each other, two top higher sidewalls facing each other, a plurality of protruding bar pressing portions protruding toward the internal space of the housing from the two top higher sidewalls, and a plurality of protruding round pressing portions protruding toward the internal space of the housing from portions at the plurality of top screw holes, the bottom cover comprises two bottom lower sidewalls facing each other, two bottom higher sidewalls facing each other, a plurality of protruding bar seating portions protruding toward the internal space of the housing from the two bottom higher sidewalls, and a plurality of protruding round seating portions protruding toward the internal space of the housing from portions at the plurality of bottom screw holes, the top package base substrate comprises a plurality of top protrusions and a plurality of top notches, the plurality of top protrusions are in contact with top surfaces of the plurality of protruding bar seating portions of the bottom cover, and bottom surfaces of the plurality of protruding round pressing portions of the top cover are in contact with the top package base substrate at the plurality of top notches, and the bottom package base substrate comprises a plurality of bottom protrusions and a plurality of bottom notches, the plurality of bottom protrusions are in contact with bottom surfaces of the plurality of protruding bar pressing portions of the top cover, and top surfaces of the plurality of protruding round seating portions of the bottom cover are in contact with the bottom package base substrate at the plurality of bottom notches.

20. The solid state drive apparatus of claim 19, wherein the plurality of protruding round pressing portions have a circular arc shape extending along peripheries of the plurality of top screw holes in a plan view, respectively, and the plurality of protruding round seating portions have a circular arc shape extending along peripheries of the plurality of bottom screw holes in a plan view, respectively.

* * * * *